United States Patent
Cao et al.

(10) Patent No.: US 11,322,642 B2
(45) Date of Patent: May 3, 2022

(54) METHOD OF MAKING RADIATION DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 124 days.

(21) Appl. No.: 16/742,803

(22) Filed: Jan. 14, 2020

(65) Prior Publication Data

US 2020/0152820 A1 May 14, 2020

Related U.S. Application Data

(63) Continuation of application No. PCT/CN2017/094472, filed on Jul. 26, 2017.

(51) Int. Cl.
*H01L 31/18* (2006.01)
*G01T 1/24* (2006.01)
(Continued)

(52) U.S. Cl.
CPC ............ *H01L 31/1836* (2013.01); *G01T 1/24* (2013.01); *H01L 21/02562* (2013.01); *H01L 27/14634* (2013.01); *H01L 27/14696* (2013.01)

(58) Field of Classification Search
CPC ........... H01L 31/0224; H01L 27/14696; H01L 21/02562
See application file for complete search history.

(56) References Cited

U.S. PATENT DOCUMENTS 5,010,381 A * 4/1991 Shiba .................. H01L 27/1443
257/184
5,198,370 A * 3/1993 Ohkura ............... H01L 31/1832
438/552
(Continued)

FOREIGN PATENT DOCUMENTS

CN      1892250 A    1/2007
CN    102074611 A    5/2011
(Continued)

OTHER PUBLICATIONS

Djuric, Z., et al. "Local growth of HgCdTe layers by isothermal vapour phase epitaxy." Electronics Letters 26.14 (1990): 1005-1006.

*Primary Examiner* — Scott B Geyer
(74) *Attorney, Agent, or Firm* — IPro, PLLC; Qian Gu

(57) ABSTRACT

Disclosed herein are a radiation detector and a method of making it. The radiation detector is configured to absorb radiation particles incident on a semiconductor single crystal of the radiation detector and to generate charge carriers. The semiconductor single crystal may be a CdZnTe single crystal or a CdTe single crystal. The method may comprise forming a recess into a substrate of semiconductor; forming a semiconductor single crystal in the recess; and forming a heavily doped semiconductor region in the substrate. The semiconductor single crystal has a different composition from the substrate. The heavily doped region is in electrical contact with the semiconductor single crystal and embedded in a portion of intrinsic semiconductor of the substrate.

20 Claims, 20 Drawing Sheets

(51) Int. Cl.
*H01L 27/146* (2006.01)
*H01L 21/02* (2006.01)

(56) References Cited

U.S. PATENT DOCUMENTS

| | | | |
|---|---|---|---|
| 5,535,699 A * | 7/1996 | Kawazu | C30B 19/04 |
| | | | 117/1 |
| 5,930,591 A | 7/1999 | Huang | |
| 6,790,701 B2 * | 9/2004 | Shigenaka | H01L 27/14652 |
| | | | 250/370.14 |
| 7,223,981 B1 * | 5/2007 | Capote | H01L 27/14634 |
| | | | 250/370.13 |
| 8,680,591 B2 * | 3/2014 | Haddad | H01L 27/14609 |
| | | | 257/291 |
| 9,761,739 B2 * | 9/2017 | Carey | H01L 31/02024 |
| 2003/0121885 A1 | 7/2003 | Wright et al. | |
| 2003/0127599 A1 * | 7/2003 | Numai | G01T 1/2928 |
| | | | 250/370.01 |
| 2008/0203514 A1 | 8/2008 | Szeles | |
| 2009/0101909 A1 * | 4/2009 | Chen | H01L 31/035281 |
| | | | 257/65 |
| 2010/0032579 A1 * | 2/2010 | Chen | G01T 1/24 |
| | | | 250/370.13 |
| 2010/0327172 A1 | 12/2010 | Tokuda et al. | |
| 2013/0119503 A1 * | 5/2013 | Chabuel | H01L 27/14647 |
| | | | 257/443 |
| 2015/0323679 A1 * | 11/2015 | Yang | G01T 1/241 |
| | | | 250/362 |
| 2016/0254407 A1 | 9/2016 | Wang et al. | |
| 2017/0194376 A1 * | 7/2017 | Kim | H01L 27/14609 |
| 2018/0374881 A1 * | 12/2018 | Rothman | H01L 27/14689 |

FOREIGN PATENT DOCUMENTS

| | | |
|---|---|---|
| CN | 102395877 A | 3/2012 |
| CN | 106662662 A | 5/2017 |
| WO | 2013041114 A1 | 3/2013 |
| WO | 2016053414 A3 | 5/2016 |
| WO | 2017063157 A1 | 4/2017 |

* cited by examiner

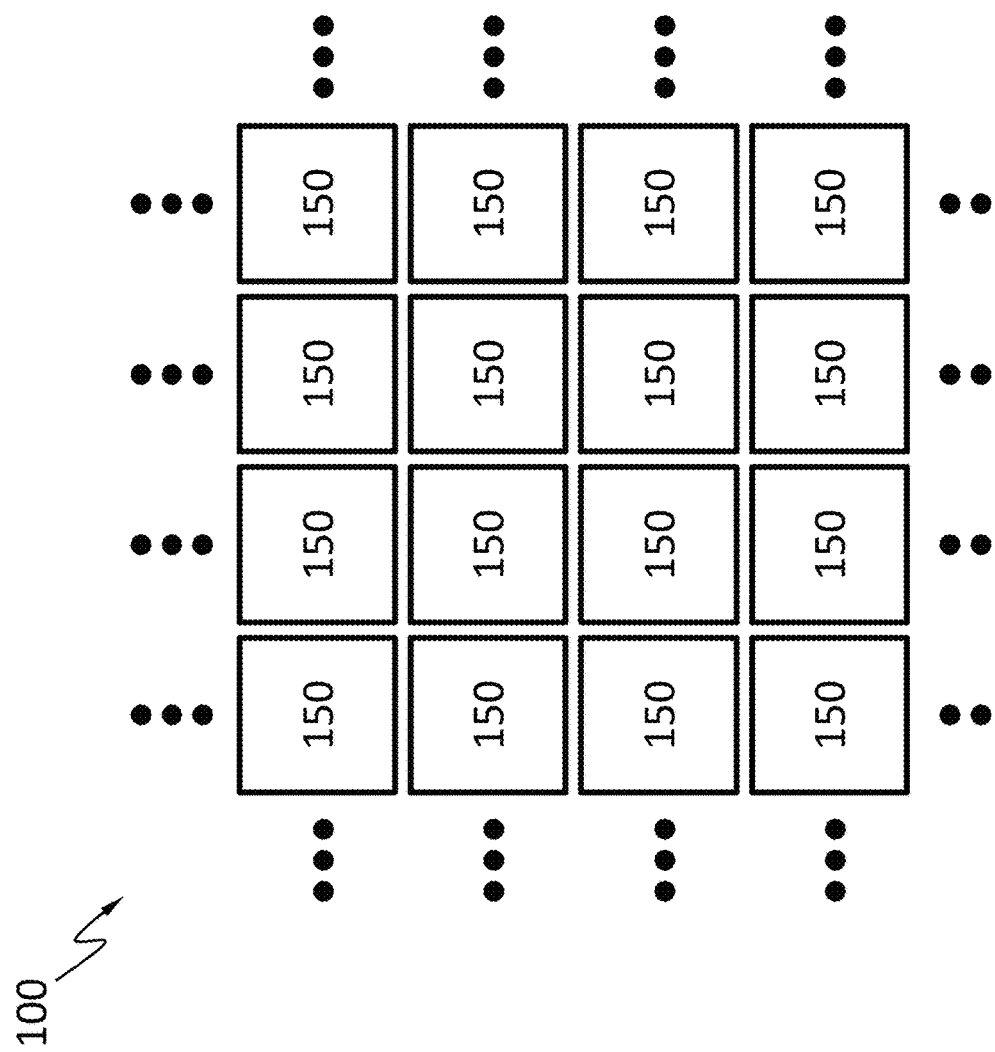

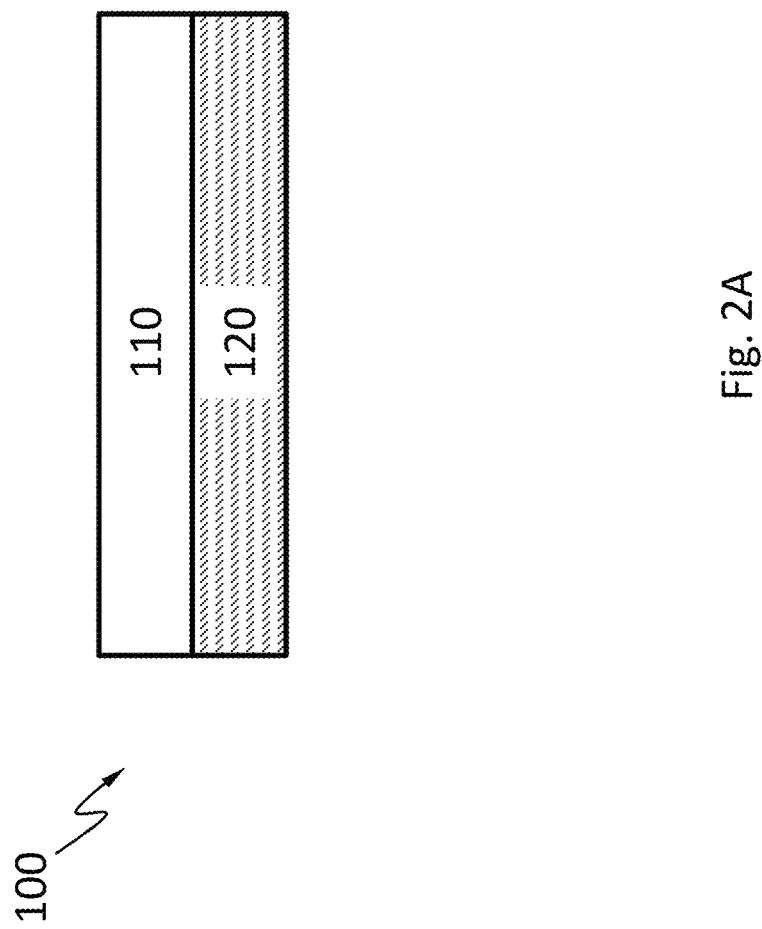

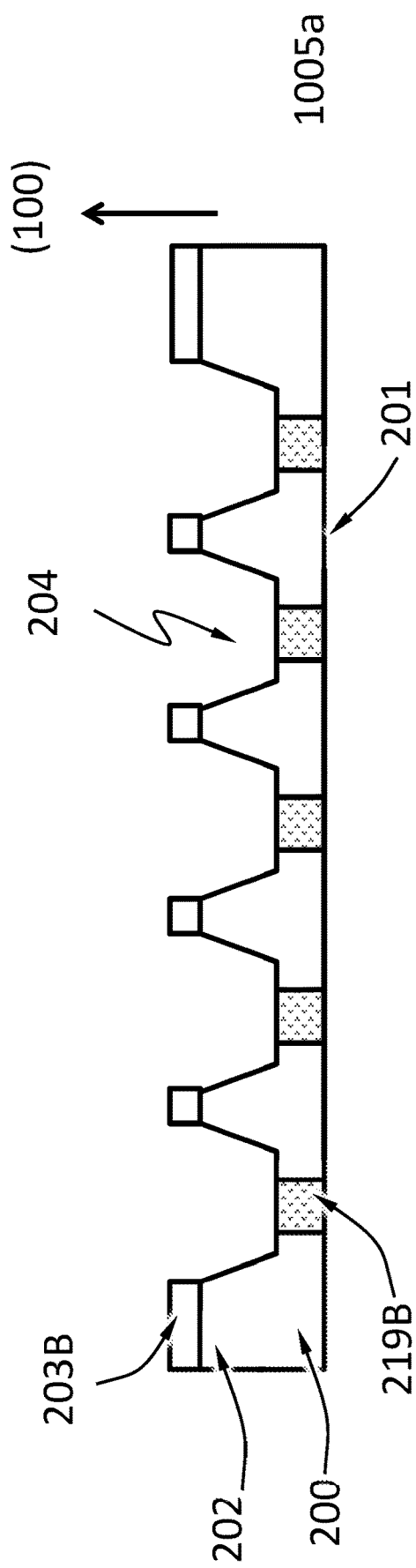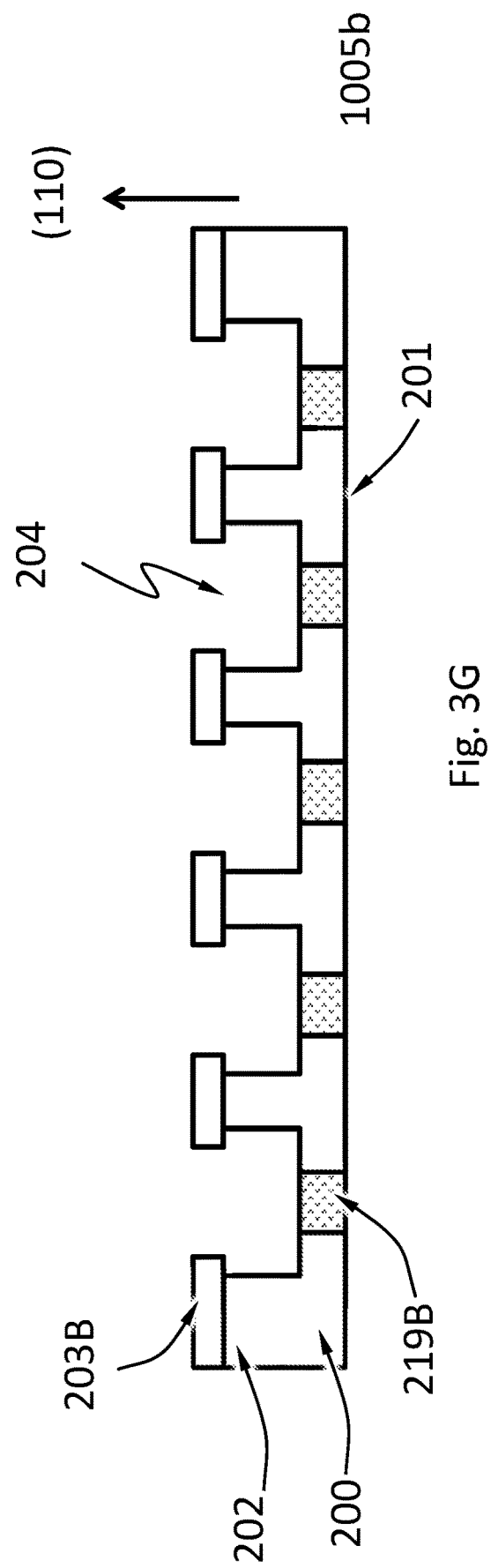

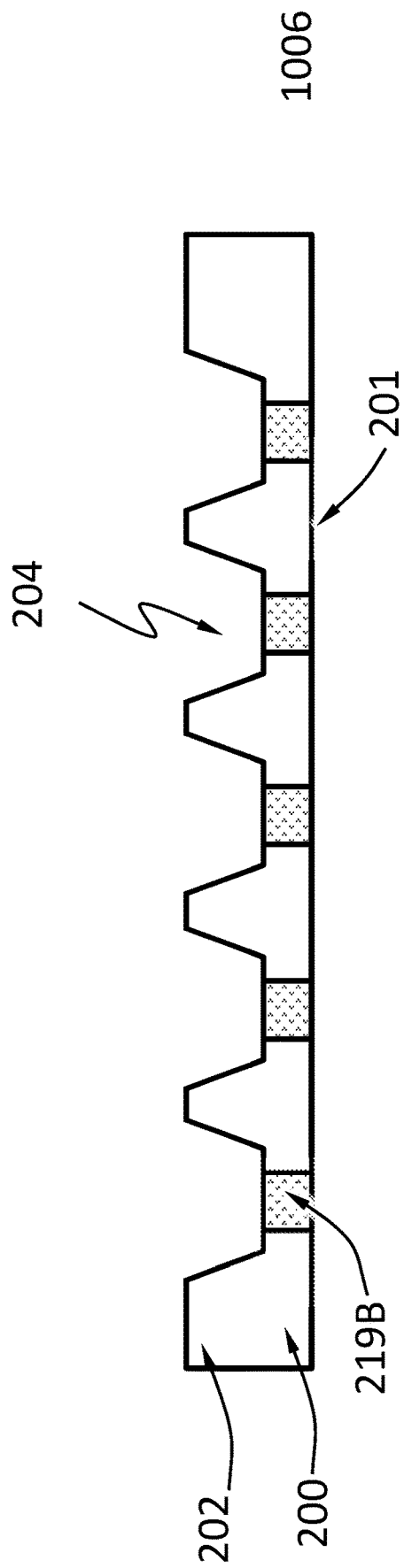
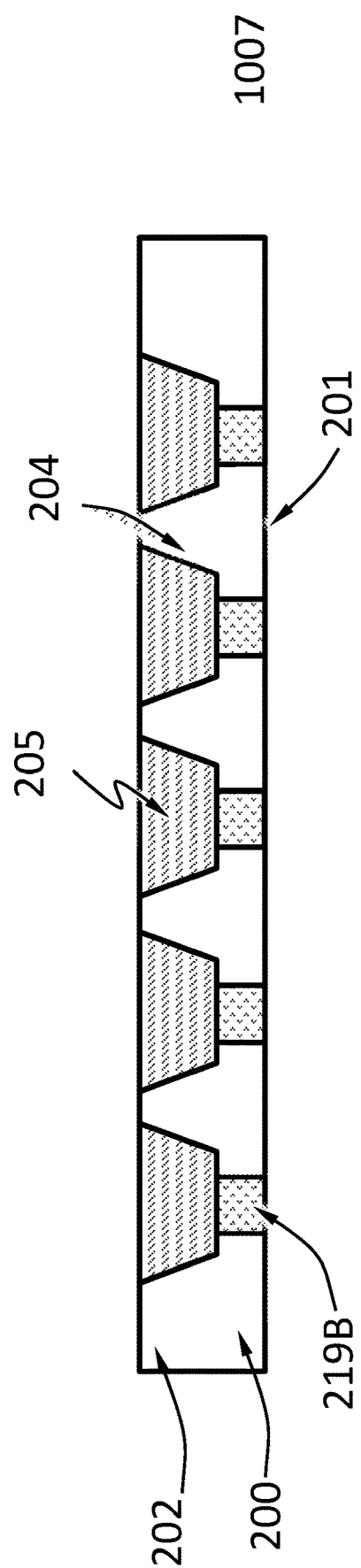
Fig. 3H
Fig. 3I

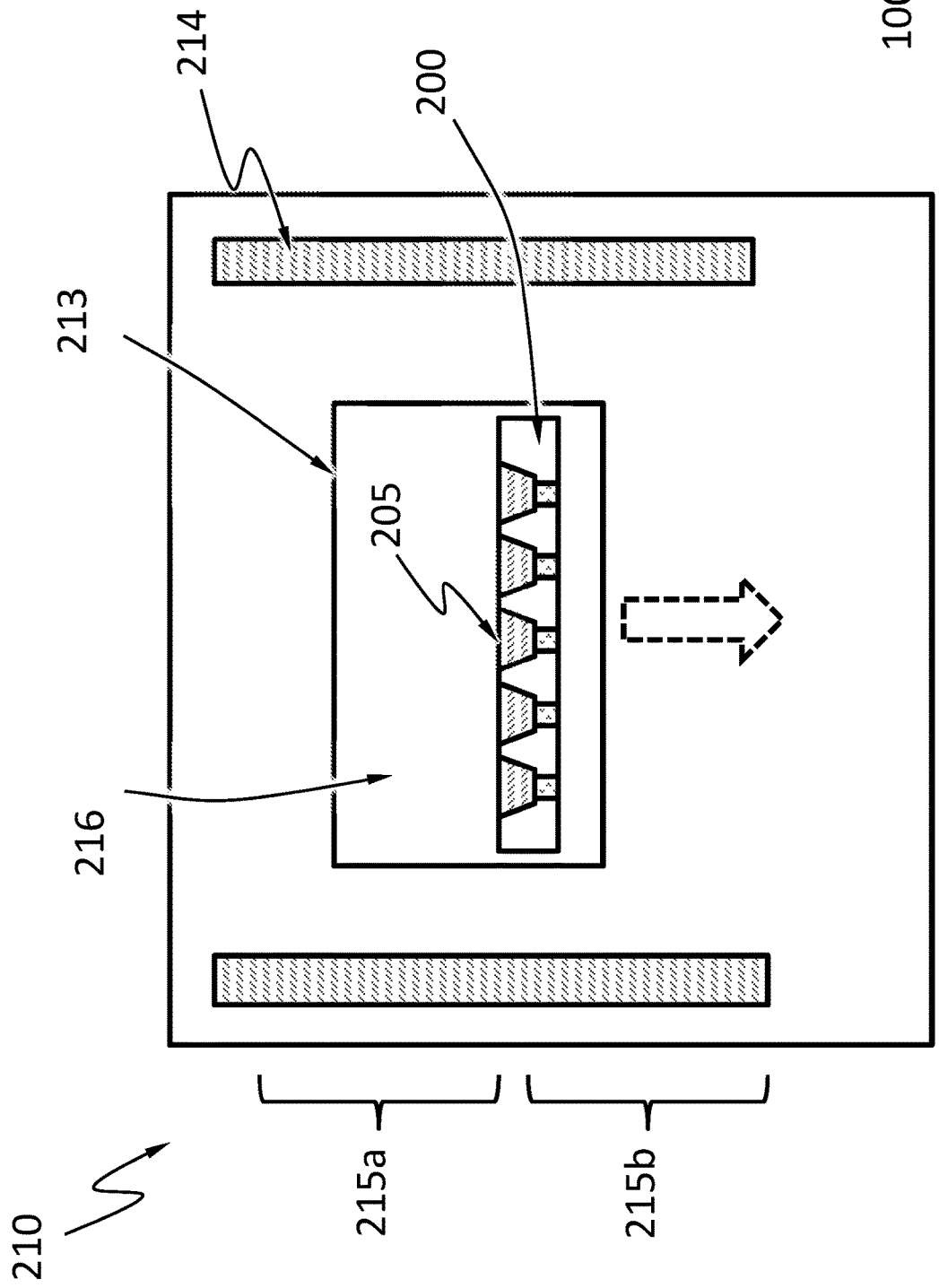

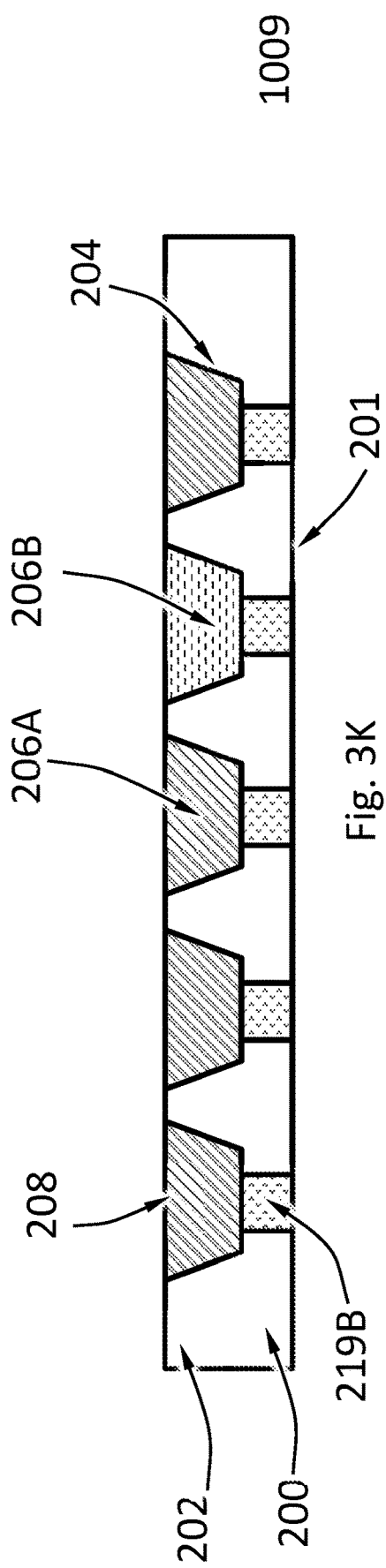
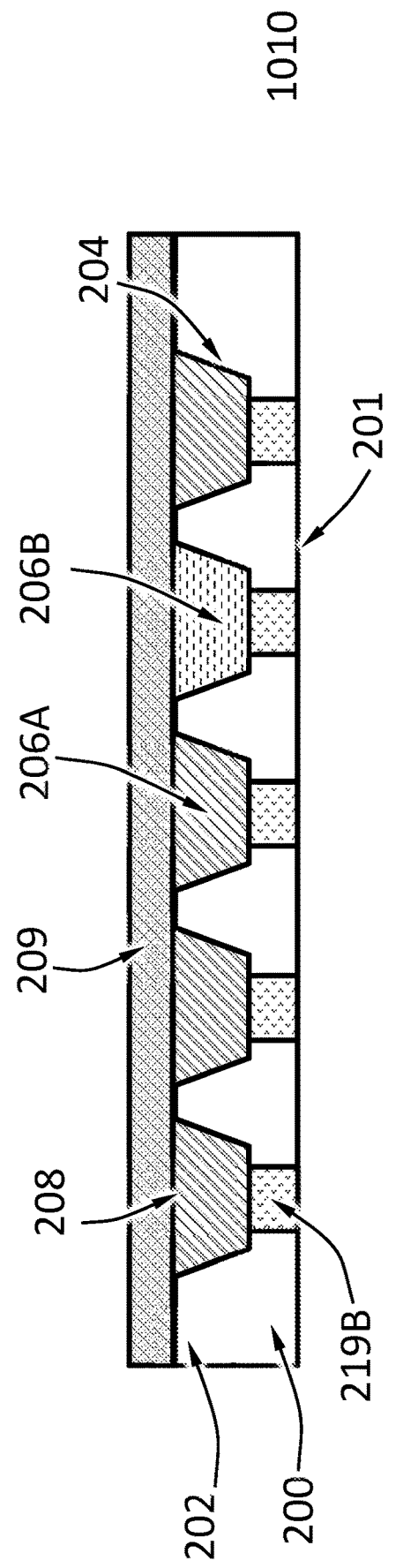

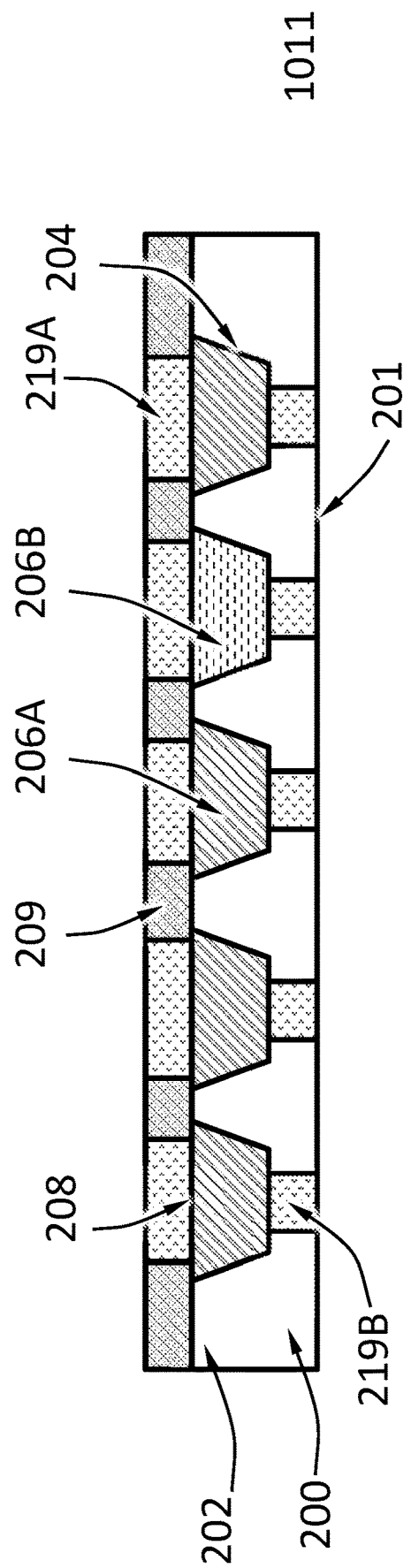
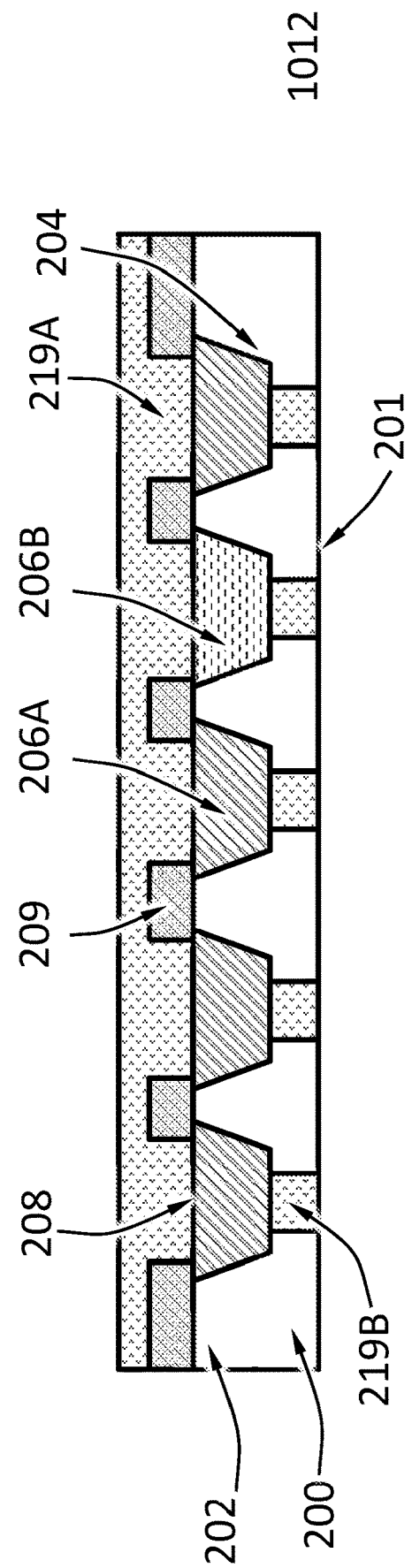

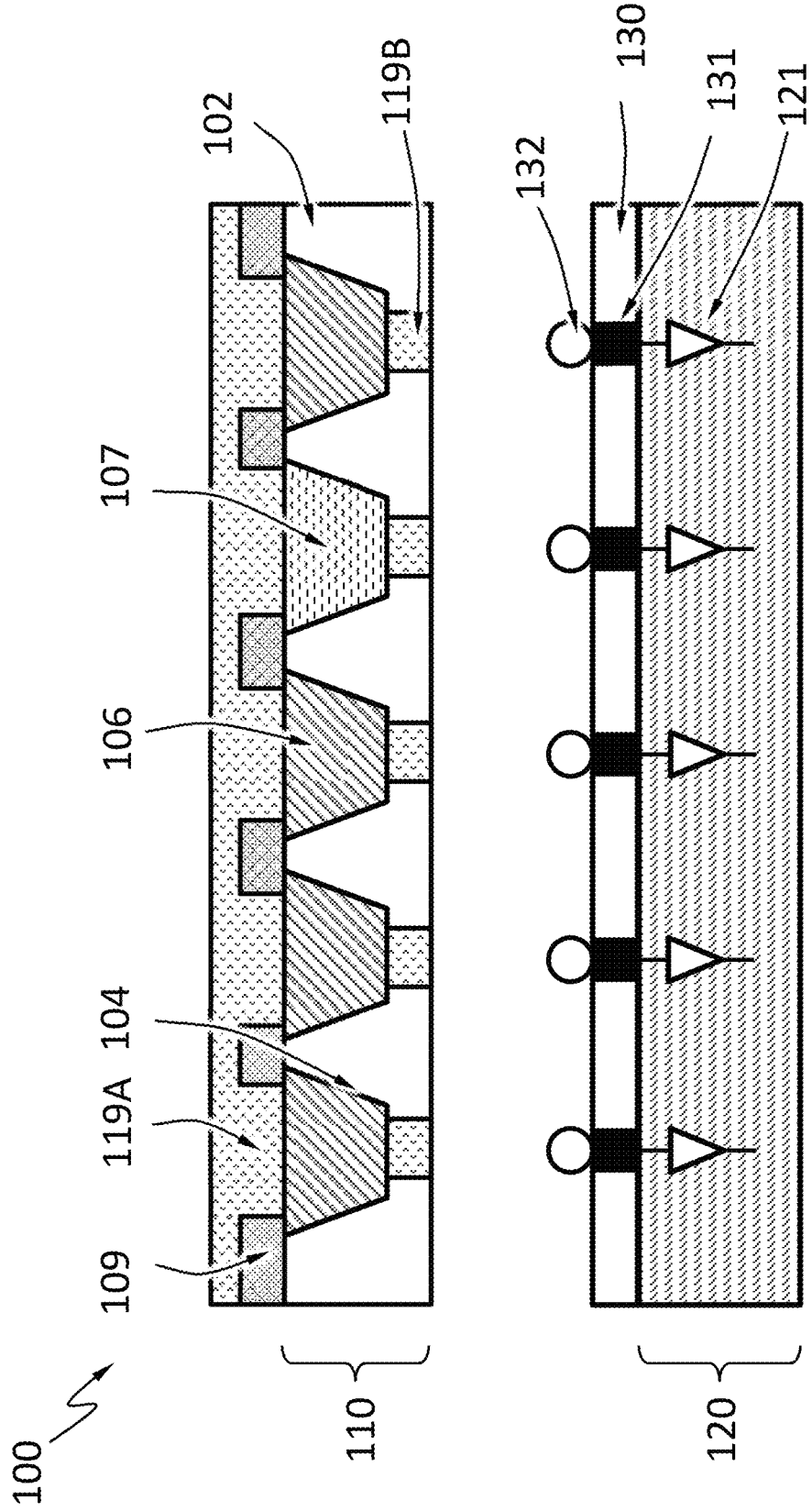

METHOD OF MAKING RADIATION DETECTOR

TECHNICAL FIELD

The disclosure herein relates to a radiation detector and methods of making it, particularly relates to a method of forming a radiation detector with a semiconductor single crystal.

BACKGROUND

A radiation detector is a device that measures a property of a radiation. Examples of the property may include a spatial distribution of the intensity, phase, and polarization of the radiation. The radiation may be one that has interacted with a subject. For example, the radiation measured by the radiation detector may be a radiation that has penetrated or reflected from the subject. The radiation may be an electromagnetic radiation such as infrared light, visible light, ultraviolet light, X-ray or γ-ray. The radiation may be of other types such as α-rays and β-rays.

One type of radiation detectors is based on interaction between the radiation and a semiconductor. For example, a radiation detector of this type may have a semiconductor layer that absorbs the radiation and generate charge carriers (e.g., electrons and holes) and circuitry for detecting the charge carriers.

Cadmium Zinc Telluride (CdZnTe, or $Cd_{1-x} Zn_xTe$) is a direct gap semiconductor and is an excellent candidate for room temperature radiation detection. Cadmium Zinc Telluride is an alloy of zinc telluride and cadmium telluride (CdTe) and the x-value is the molar concentration of Zn in CdZnTe. CdZnTe with x-value from 0.04 to 0.2 is considered promising for detector development as it processes and improves some of the properties of CdTe. For example, both CdTe and CdZnTe have large atomic number that gives the material excellent stopping power for high absorption efficiencies for incident X-rays, γ-rays, and have large band gaps (e.g., 1.5 eV-1.6 eV) allowing room temperature detector operations and have high resistivity to achieve a good signal-to-noise ratio of the radiation detectors. Meanwhile, the CdZnTe has a larger band gap than CdTe due to incorporation of Zn hence increases the maximum achievable electrical resistivity.

The practical use of CdTe and CdZnTe detectors covers a wide variety of applications, such as medical and industrial imaging, industrial gauging and non-destructive testing, security and monitoring, nuclear safeguards and non-proliferation, and astrophysics.

SUMMARY

Disclosed herein is a method comprising: forming a recess into a substrate of semiconductor; forming a semiconductor single crystal in the recess, the semiconductor single crystal having a different composition from the substrate and having a surface exposed; forming a heavily doped semiconductor region in the substrate, wherein the heavily doped region is in electrical contact with the semiconductor single crystal and embedded in a portion of intrinsic semiconductor of the substrate.

According to an embodiment, the heavily doped semiconductor region extends from an interface between the semiconductor single crystal and the substrate to a surface of the substrate.

According to an embodiment, forming the heavily doped semiconductor region is carried out before forming the recess.

According to an embodiment, forming the heavily doped semiconductor region is carried out before forming the semiconductor single crystal.

According to an embodiment, the method further comprises forming an electrical contact on the surface of the semiconductor single crystal and depositing a passivation layer on the surface of the semiconductor single crystal or a surface of the substrate; wherein the electrical contact is embedded in the passivation layer.

According to an embodiment, the method further comprises polishing the substrate or the semiconductor single crystal such that the surface of the semiconductor single crystal and the surface of the substrate are coextensive.

According to an embodiment, the method further comprises depositing a layer of conductive material on the passivation layer and the electrical contact.

According to an embodiment, the passivation layer comprises silicon dioxide, silicon nitride.

According to an embodiment, the substrate comprises silicon, germanium, GaAs or a combination thereof.

According to an embodiment, the semiconductor single crystal is a cadmium zinc telluride (CdZnTe) single crystal or a cadmium telluride (CdTe) single crystal.

According to an embodiment, the recess does not contain other semiconductor material except the semiconductor single crystal, after forming the semiconductor single crystal.

According to an embodiment, the recess does not contain a semiconductor polycrystal, after forming the semiconductor single crystal.

According to an embodiment, the recess has a shape of a frustum, prism, pyramid, cuboid, cubic or cylinder.

According to an embodiment, forming the recess comprises forming a mask on the substrate and etching a portion of the substrate uncovered by the mask.

According to an embodiment, etching the portion is done by wet etching, dry etching or a combination thereof.

According to an embodiment, forming the semiconductor single crystal in the recess comprises depositing semiconductor particles into the recess, forming a melt by melting the semiconductor particles, and recrystallizing the melt in the recess.

According to an embodiment, recrystallizing the melt in the recess involves cooling the melt at a rate that the melt recrystallizes into a single crystal.

According to an embodiment, cooling the melt is done by moving the melt from a zone with a temperature above or equal to a melting point of the semiconductor particles to another zone with a temperature below the melting point.

According to an embodiment, forming the semiconductor single crystal comprises using a vapor phase precursor.

According to an embodiment, the method further comprises bonding the substrate to another substrate comprising an electronic system therein or thereon, wherein the electronic system is electrically connect to the substrate and configured to process an electrical signal generated in the substrate.

Disclosed herein is a radiation detector comprising: a substrate of an intrinsic semiconductor; a semiconductor single crystal in a recess in the substrate, the semiconductor single crystal having a different composition from the intrinsic semiconductor; a heavily doped semiconductor region embedded in the intrinsic semiconductor and in electrical contact with the semiconductor single crystal; wherein the radiation detector is configured to absorb radiation particles incident on the semiconductor single crystal and to generate charge carriers.

According to an embodiment, the heavily doped semiconductor region extends from an interface between the semiconductor single crystal and the substrate to a surface of the substrate.

According to an embodiment, the radiation detector further comprises a passivation layer on a surface of the semiconductor single crystal or on a surface of the substrate and comprising an electrical contact embedded in the passivation layer and in contact with the semiconductor single crystal.

According to an embodiment, the electrical contact further comprises a planar portion covering a surface of the passivation layer.

According to an embodiment, the passivation layer comprises silicon dioxide, silicon nitride.

According to an embodiment, a surface of the semiconductor single crystal and the surface of the substrate are coextensive.

According to an embodiment, the substrate comprises silicon, germanium, GaAs or a combination thereof.

According to an embodiment, the semiconductor single crystal is a CdZnTe single crystal or a CdTe single crystal.

According to an embodiment, the recess does not contain other semiconductor material except the semiconductor single crystal.

According to an embodiment, the recess does not contain a semiconductor polycrystal.

According to an embodiment, the recess has a shape of a frustum, prism, pyramid, cuboid, cubic or cylinder.

According to an embodiment, the radiation detector further comprises an electronics layer bonded to the substrate, the electronics layer comprising an electronic system configured to process an electrical signal generated from the charge carriers collected by the heavily doped semiconductor region.

According to an embodiment, the electronic system comprises a voltage comparator configured to compare a voltage of the heavily doped semiconductor region to a first threshold; a counter configured to register a number of radiation particles absorbed by the substrate; a controller; a voltmeter; wherein the controller is configured to start a time delay from a time at which the voltage comparator determines that an absolute value of the voltage equals or exceeds an absolute value of the first threshold; wherein the controller is configured to cause the voltmeter to measure the voltage upon expiration of the time delay; wherein the controller is configured to determine a number of radiation particles by dividing the voltage measured by the voltmeter by a voltage that a single radiation particle would have caused on the heavily doped semiconductor region; wherein the controller is configured to cause the number registered by the counter to increase by the number of radiation particles.

According to an embodiment, the electronic system further comprising a capacitor module electrically connected to the heavily doped semiconductor region, wherein the capacitor module is configured to collect charge carriers from the heavily doped semiconductor region.

According to an embodiment, the controller is configured to connect the heavily doped semiconductor region to an electrical ground.

According to an embodiment, the controller is configured to deactivate the voltage comparator at a beginning of the time delay.

BRIEF DESCRIPTION OF FIGURES

FIG. 1 schematically shows a radiation detector, as an example.

FIG. 2A schematically shows a cross-sectional view of the radiation detector, according to an embodiment.

FIG. 4 schematically illustrates bonding between the radiation absorption layer and the electronics layer to form the radiation detector, according an embodiment.

DETAILED DESCRIPTION

Figure 2B:
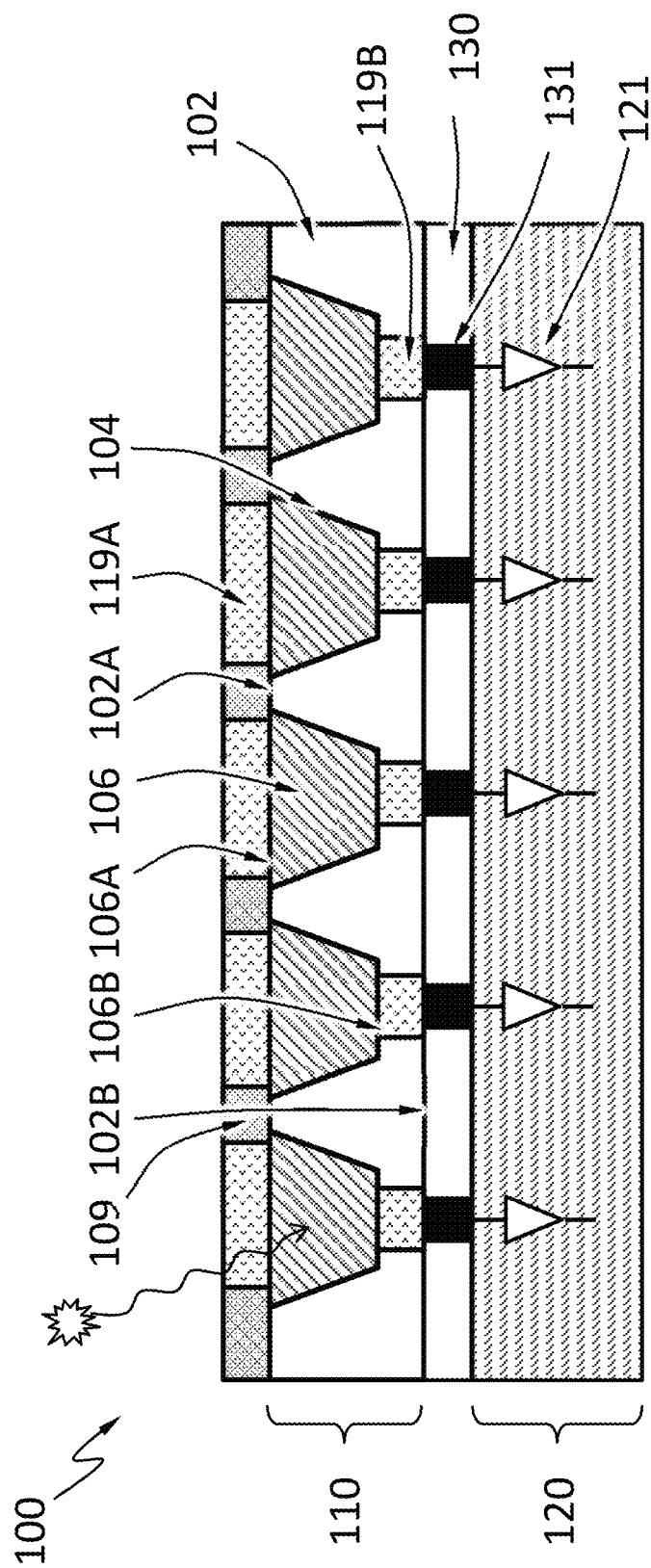
FIG. 2B and FIG. 2C each schematically show a detailed cross-sectional view of the radiation detector, according to an embodiment.

FIG. 1 schematically shows a radiation detector 100, as an example. The radiation detector 100 has an array of pixels 150. The array may be a rectangular array, a honeycomb array, a hexagonal array or any other suitable array. Each pixel 150 is configured to detect radiation from a radiation source incident thereon and may be configured measure a characteristic (e.g., the energy of the particles, the wavelength, and the frequency) of the radiation. For example, each pixel 150 is configured to count numbers of radiation particles (e.g., photons) incident thereon whose energy falls in a plurality of bins, within a period of time. All the pixels 150 may be configured to count the numbers of radiation particles incident thereon within a plurality of bins of energy within the same period of time. When the incident radiation particles have similar energy, the pixels 150 may be simply configured to count numbers of radiation particles incident thereon within a period of time, without measuring the energy of the individual radiation particles. Each pixel 150 may have its own analog-to-digital converter (ADC) configured to digitize an analog signal representing the energy of an incident radiation particle into a digital signal, or to digitize an analog signal representing the total energy of a plurality of incident radiation particles into a digital signal. Each pixel 150 may be configured to measure its dark current, such as before or concurrently with each radiation particle incident thereon. Each pixel 150 may be configured to deduct the contribution of the dark current from the energy of the radiation particle incident thereon. The pixels 150 may be configured to operate in parallel. For example, when one pixel 150 measures an incident radiation particle, another pixel 150 may be waiting for a radiation particle to arrive. The pixels 150 may not have to be individually addressable.

FIG. 2A schematically shows a cross-sectional view of the radiation detector 100, according to an embodiment. The radiation detector 100 may include a radiation absorption layer 110 configured to absorb an incident radiation and generate electrical signals from incident radiation, and an electronics layer 120 (e.g., an ASIC) for processing or analyzing the electrical signals generates in the radiation absorption layer 110. The radiation detector 100 may or may not include a scintillator. The radiation absorption layer 110 may include a semiconductor material such as silicon, germanium, GaAs, CdTe, CdZnTe, or a combination thereof. The semiconductor may have a high mass attenuation coefficient for the radiation of interest.

Figure 2C:
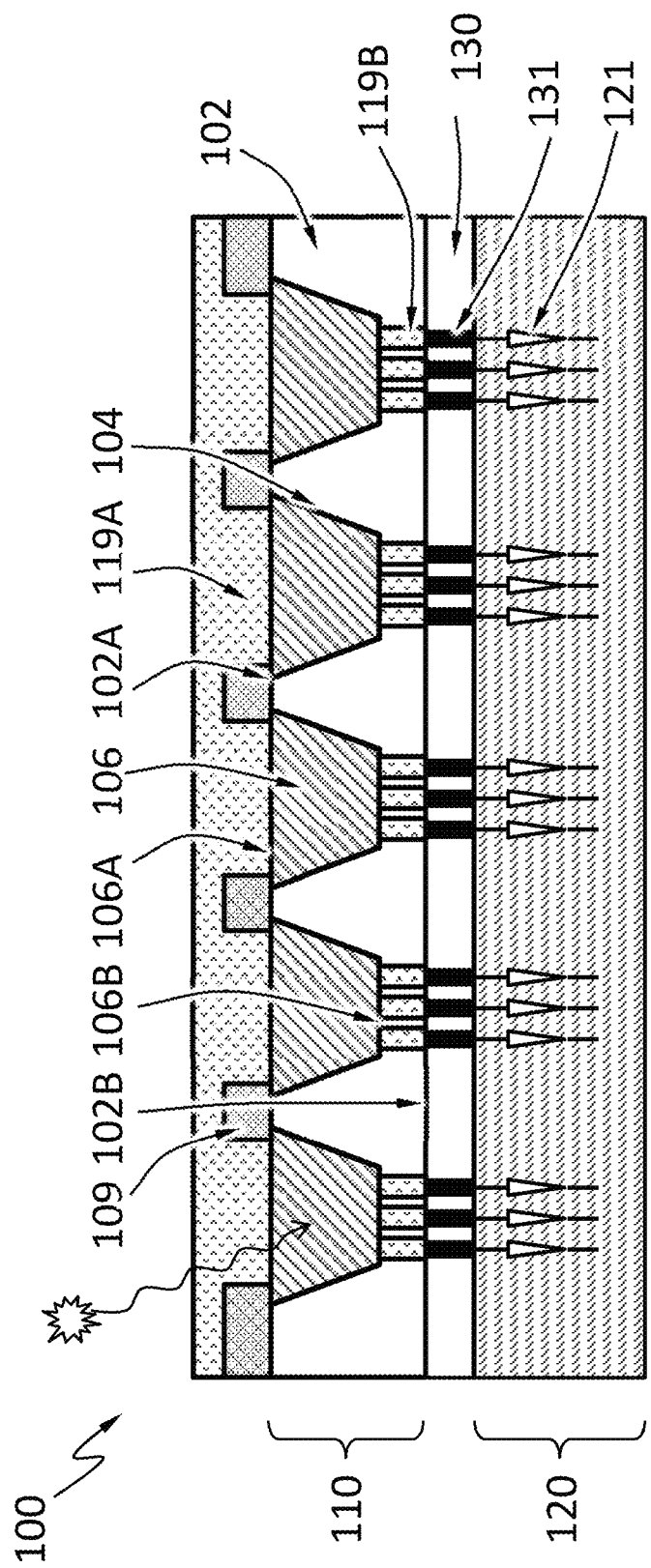

FIG. 2B and FIG. 2C each schematically show a detailed cross-sectional view of the radiation detector 100, according to an embodiment. The radiation absorption layer 110 may comprise a substrate 102, a recess 104 in the substrate 102, the recess 104 having a semiconductor single crystal 106 therein, an electrical contact 119B comprising a heavily doped semiconductor region embedded in the substrate 102 and in electrical contact with the semiconductor single crystal 106.

The phrase "heavily doped" is not a term of degree. A heavily doped semiconductor has its electrical conductivity comparable to metals and exhibits essentially linear positive thermal coefficient. In a heavily doped semiconductor, the dopant energy levels are merged into an energy band. A heavily doped semiconductor is also called degenerate semiconductor. The heavily doped semiconductor region of the electrical contact 119B may have a doping level of $10^{18}$ dopants/cm$^3$ or above.

The substrate 102 may comprise a semiconductor material selected from a group consisting of silicon, germanium, GaAs and a combination thereof. The substrate 102 may be an intrinsic semiconductor (e.g., $<10^{12}$ dopants/cm$^3$, $<10^{11}$ dopants/cm$^3$, $<10^{10}$ dopants/cm$^3$, $<10^{9}$ dopants/cm$^3$).

In an embodiment, the recess 104 has one and only one semiconductor single crystal 106, i.e., the recess 104 contains no other semiconductor material except the one semiconductor single crystal 106. A surface 106A of the semiconductor single crystal 106 may be coextensive with a surface 102A of the substrate 102. The semiconductor single crystal 106 has a different composition from the substrate 102. Namely, the semiconductor single crystal 106 does not merely differ from the substrate 102 in terms of doping. The semiconductor single crystal 106 is not formed by doping the substrate 102. For example, if the substrate 102 is silicon, the semiconductor single crystal 106 is not doped or intrinsic silicon. The semiconductor single crystals 106 may be a cadmium zinc telluride (CdZnTe) single crystal, a cadmium telluride (CdTe) single crystal, or another suitable single crystal that can absorb radiation particles incident thereon and generate charge carriers. The semiconductor single crystal 106 may have a sufficient thickness and thus a sufficient absorbance (e.g., >80% or >90%) for incident radiation particles of interest (e.g., X-ray photons). For example, the semiconductor single crystal 106 may be a CdZnTe single crystal with a thickness of 2 mm to 15 mm, or even thicker.

The heavily doped semiconductor region of the electrical contact 119B may have a thickness of a few micrometers. The heavily doped semiconductor region may extend from an interface 106B between the semiconductor single crystal 106 and the substrate 102 to a surface 102B of the substrate 102, as shown in the examples of FIG. 2B and FIG. 2C.

In the example of FIG. 2B and FIG. 2C, the substrate 102 comprises multiple recesses 104, each of which may comprise a semiconductor single crystal 106 therein; and the electrical contact 119B comprises multiple heavily doped semiconductor regions. The semiconductor single crystals 106 each may be in electrical contact with one or more of the heavily doped semiconductor regions. In the example of FIG. 2B, each of the semiconductor single crystals 106 has only one heavily doped semiconductor region in electrical contact with it. In the example of FIG. 2C, each of the semiconductor single crystals 106 has multiple heavily doped semiconductor regions in electrical contact with it.

The radiation detector 100 may further comprise a passivation layer 109 on the surface 106A of the semiconductor single crystal 106 or the surface 102A of the substrate 102, another electrical contact 119A embedded in the passivation layer 109 and in electrical contact with the semiconductor single crystal 106. The electrical contacts 119A and 119B may be configured to collect the charge carriers generated in the semiconductor single crystal 106. The electrical contacts 119A and 119B are not in direct electrical contact with each other.

The electrical contact 119A and the passivation layer 109 may be on the radiation receiving side of the radiation detector 100, as shown in the example of FIG. 2B and FIG. 2C. The electrical contact 119A may comprise a conducting material such as a metal (e.g., gold, copper, aluminum, platinum, etc.), or any other suitable conducting materials (e.g., a doped semiconductor). A Schottky barrier contact or an Ohmic contact may form between the electrical contact 119A and the semiconductor single crystal 106. For example, gold or platinum may form a Schottky barrier with a CdZnTe single crystal. The electrical contact 119A may be a metal-semiconductor (MS) contact. The electrical contact 119A may be a metal-insulator-semiconductor (MIS) contact. The electrical contact 119A may be embedded in the passivation layer 109 and have a surface exposed. In the example of FIG. 2B, the electrical contact 119A comprises multiple discrete regions in electrical contact with the semiconductor single crystals 106 respectively, and the discrete regions each have a surface exposed. The electrical contact 119A may further comprise a planar portion covering a surface of the passivation layer 109. In the example of FIG. 2C, the planar portion covers the entire passivation layer 109 and connects the discrete regions of the electrical contact 119A.

The passivation layer 109 may comprise silicon dioxide, silicon nitride or another high-resistivity material suitable for surface passivation. The passivation layer 109 may be configured to prevent surface leakage currents, reduce detrimental surface charges and improve mechanical stability of the radiation absorption layer 110.

The electronics layer 120 may include an electronic system 121 configured to process electrical signals on the electrical contact 119B generated from the charge carriers collected. The electronic system 121 may include an analog circuitry such as a filter network, amplifiers, integrators, and comparators, or a digital circuitry such as a microprocessors, and memory. The electronic system 121 may include one or more ADCs. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the radiation absorption layer 110. Other bonding techniques are possible to connect the electronic system 121 to the pixels without using vias.

When the radiation hits the radiation absorption layer 110, the semiconductor single crystals 106 may absorb the radiation particles incident thereon and generate one or more charge carriers by a number of mechanisms. A particle of the radiation may generate 1 to 100000 charge carriers. The charge carriers may comprise electrons and holes. The charge carriers may drift to the electrical contacts 119A and 119B under an electric field. For example, the holes may drift to the electrical contact 119A, and the electrons may drift to the electrical contact 119B. The field may be an external electric field. In an embodiment, one type of the charge carriers (e.g., electrons) may drift in directions such that the charge carriers of this type (e.g., electrons) generated by a single particle of the radiation are not substantially shared by two different heavily doped semiconductor regions of the electrical contact 119B ("not substantially shared" here means less than 2%, less than 0.5%, less than 0.1%, or less than 0.01% of the charge carriers of this type (e.g., electrons) flow to a different one of the heavily doped semiconductor regions than the rest of the charge carriers of this type). Charge carriers of this type (e.g., electrons) generated by a radiation particle incident around the footprint of one of these heavily doped semiconductor regions of the electrical contact 119B are not substantially shared with another of these heavily doped semiconductor regions of the electrical contact 119B. A pixel 150 associated with a heavily doped semiconductor region of the electrical contact 119B may be an area around the heavily doped semiconductor region in which substantially all (more than 98%, more than 99.5%, more than 99.9% or more than 99.99% of) charge carriers of this type (e.g., electrons) generated by a particle of the radiation incident therein flow to the heavily doped semiconductor region of the electrical contact 119B. Namely, less than 2%, less than 0.5%, less than 0.1%, or less than 0.01% of the charge carriers of this type (e.g., electrons) flow beyond the pixel 150 associated with the one heavily doped semiconductor region of the electrical contact 119B.

Figure 2D:
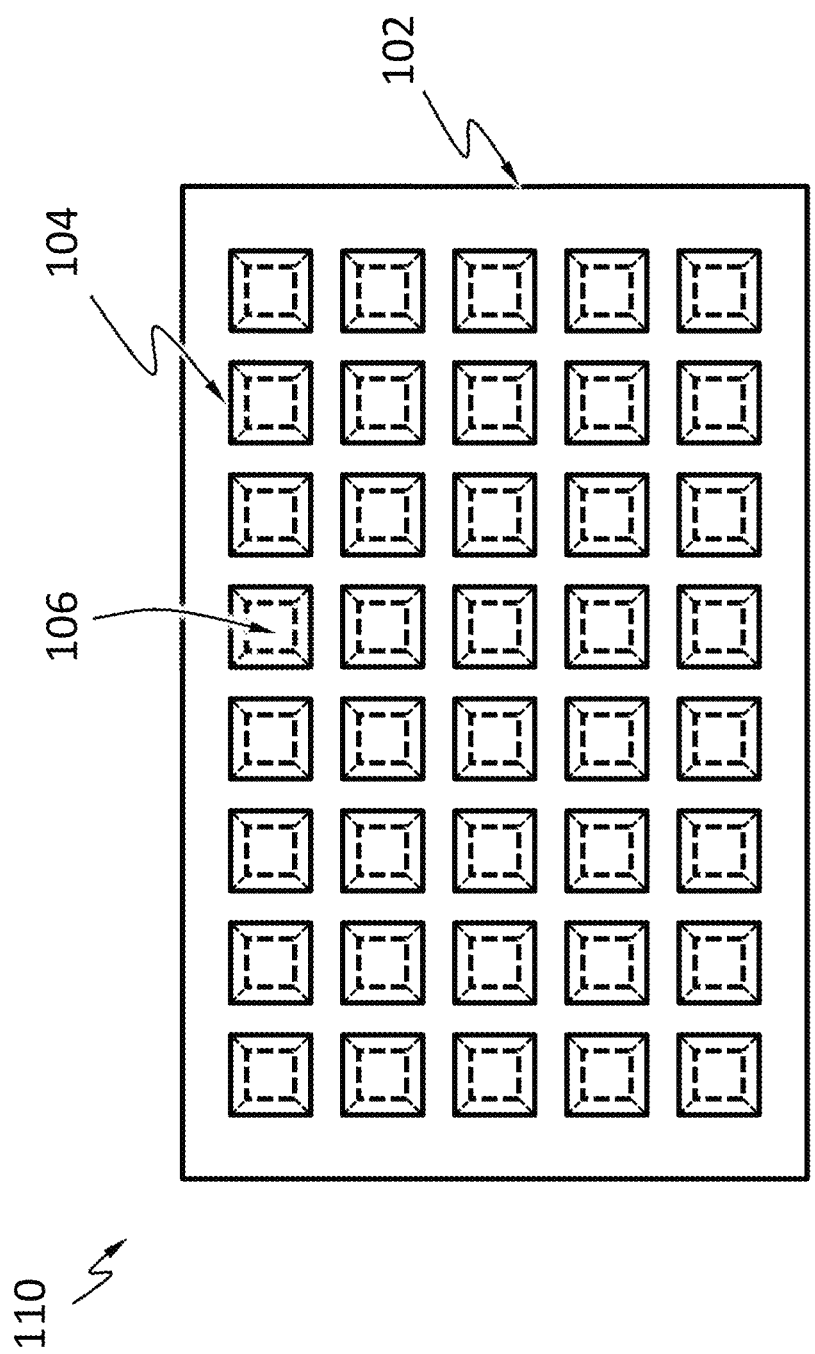
FIG. 2D-FIG. 2F each schematically show a top view of the radiation absorption layer, according to an embodiment.
Figure 2E:
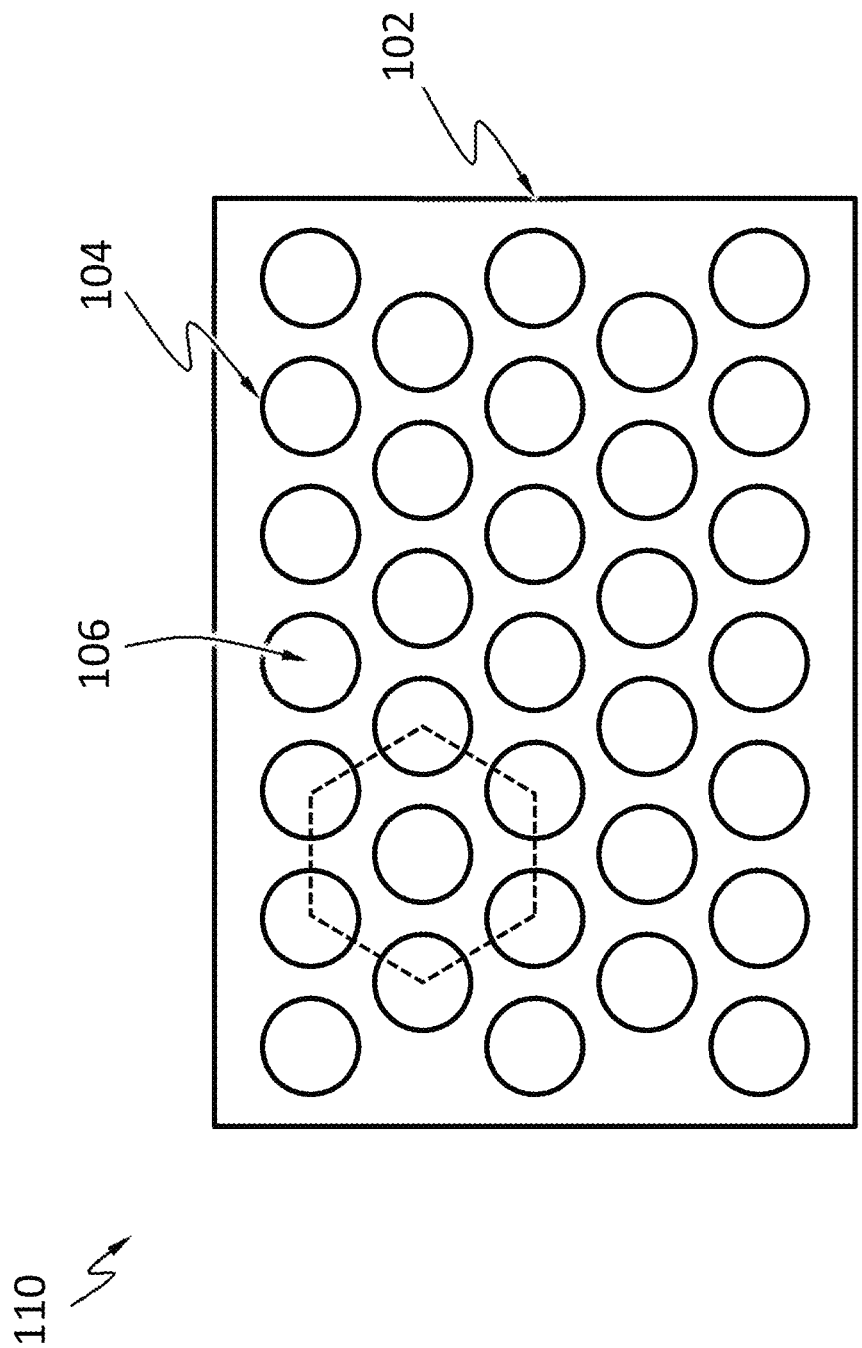
Figure 2F:
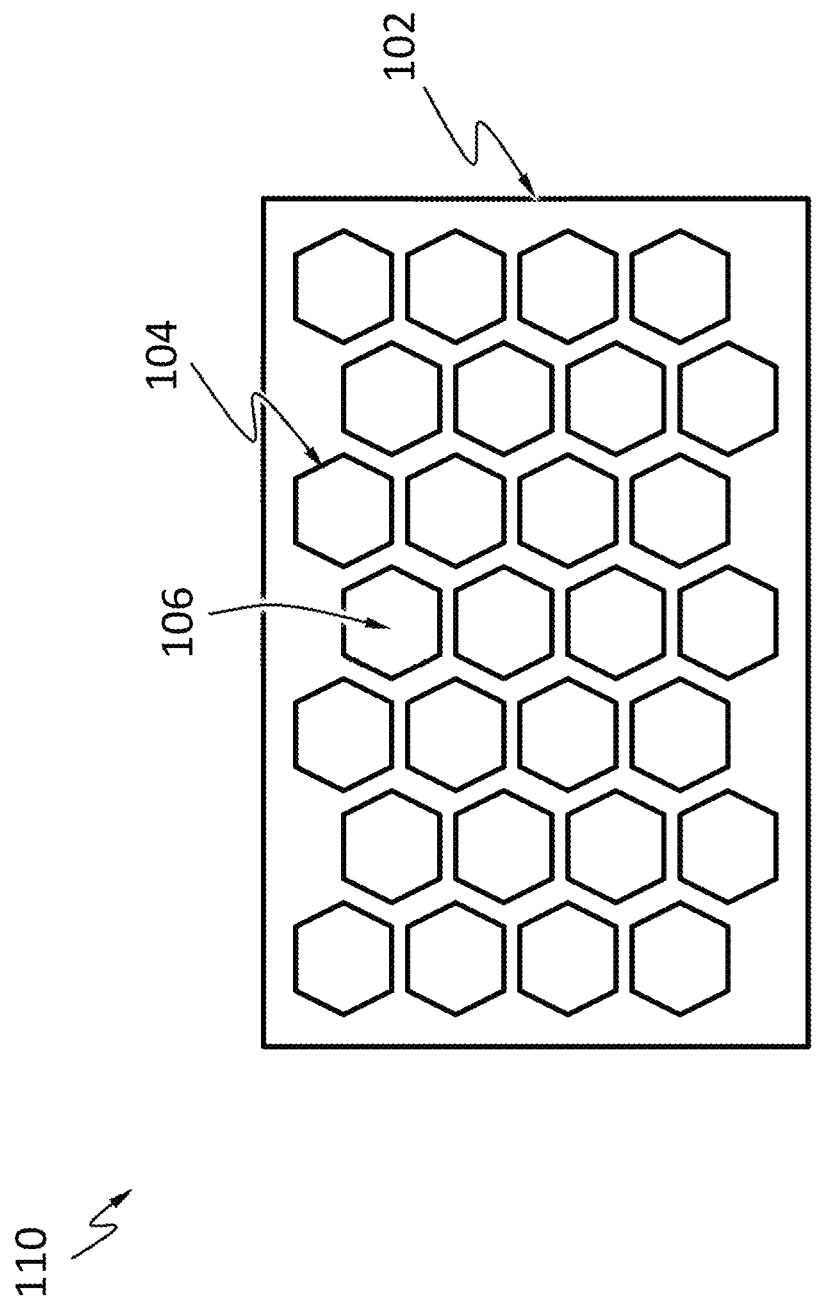

FIG. 2D-FIG. 2F each schematically show a top view of the radiation absorption layer 110, according to an embodiment. The recess 104 may have a shape of a frustum, prism, pyramid, cuboid, cubic or cylinder. The radiation absorption layer 110 may have multiple recesses 104 arranged into an array such as a rectangular array, a honeycomb array, a hexagonal array or any other suitable array. In the example of FIG. 2D, the recesses 104 are arranged into a rectangular array, and each of the recesses 104 has a truncated pyramid shape. In the examples of FIG. 2E and FIG. 2F, the recesses 104 are arranged into a hexagonal array, and each of the recesses 104 has a cylindrical shape in FIG. 2E and a prism shape in FIG. 2F. The spacing between the recesses 104 (e.g., the shortest distance between the perimeters of the recesses 104) may be less than 10 μm, less than 20 μm, or less than 30 μm. The semiconductor single crystals 106 may each have a surface area in the range of 1-10000 μm$^2$ or any other suitable size.

Figure 3A:
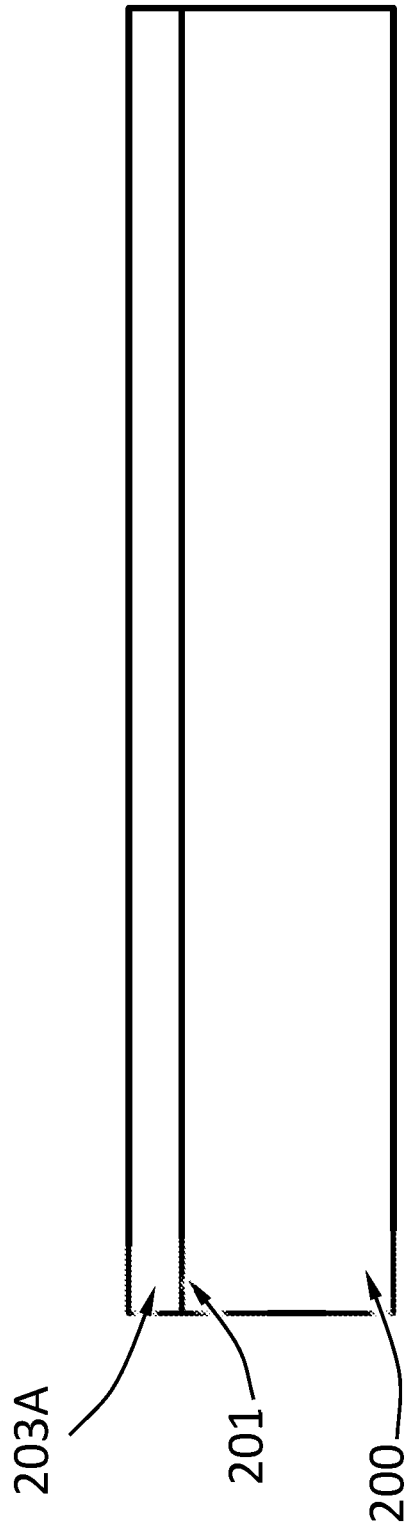
FIGS. 3A-3N schematically illustrate a process of forming the radiation absorption layer, according to an embodiment.
Figure 3B:
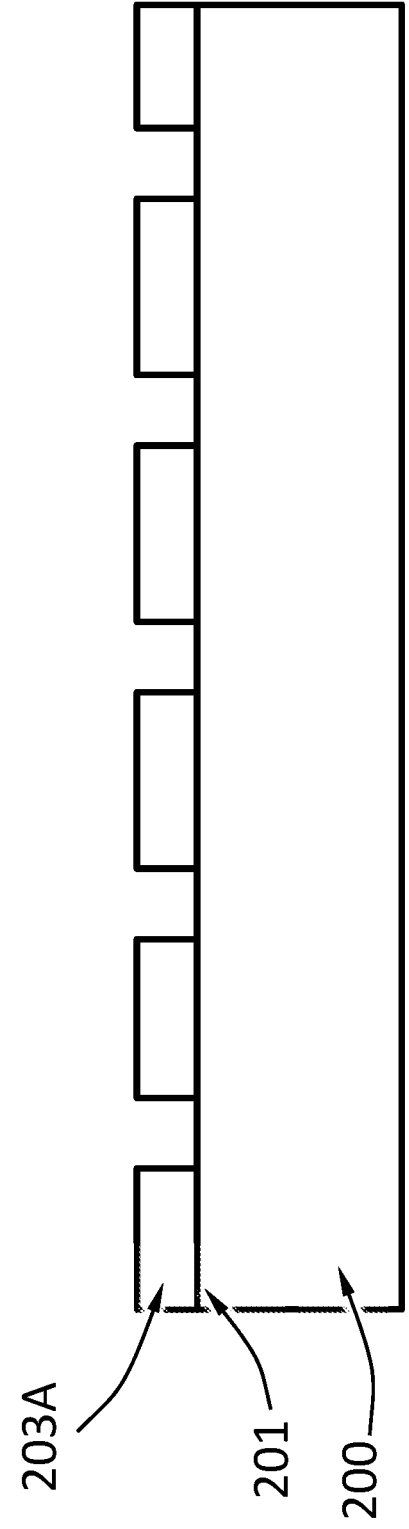
Figures 3C, 3D:
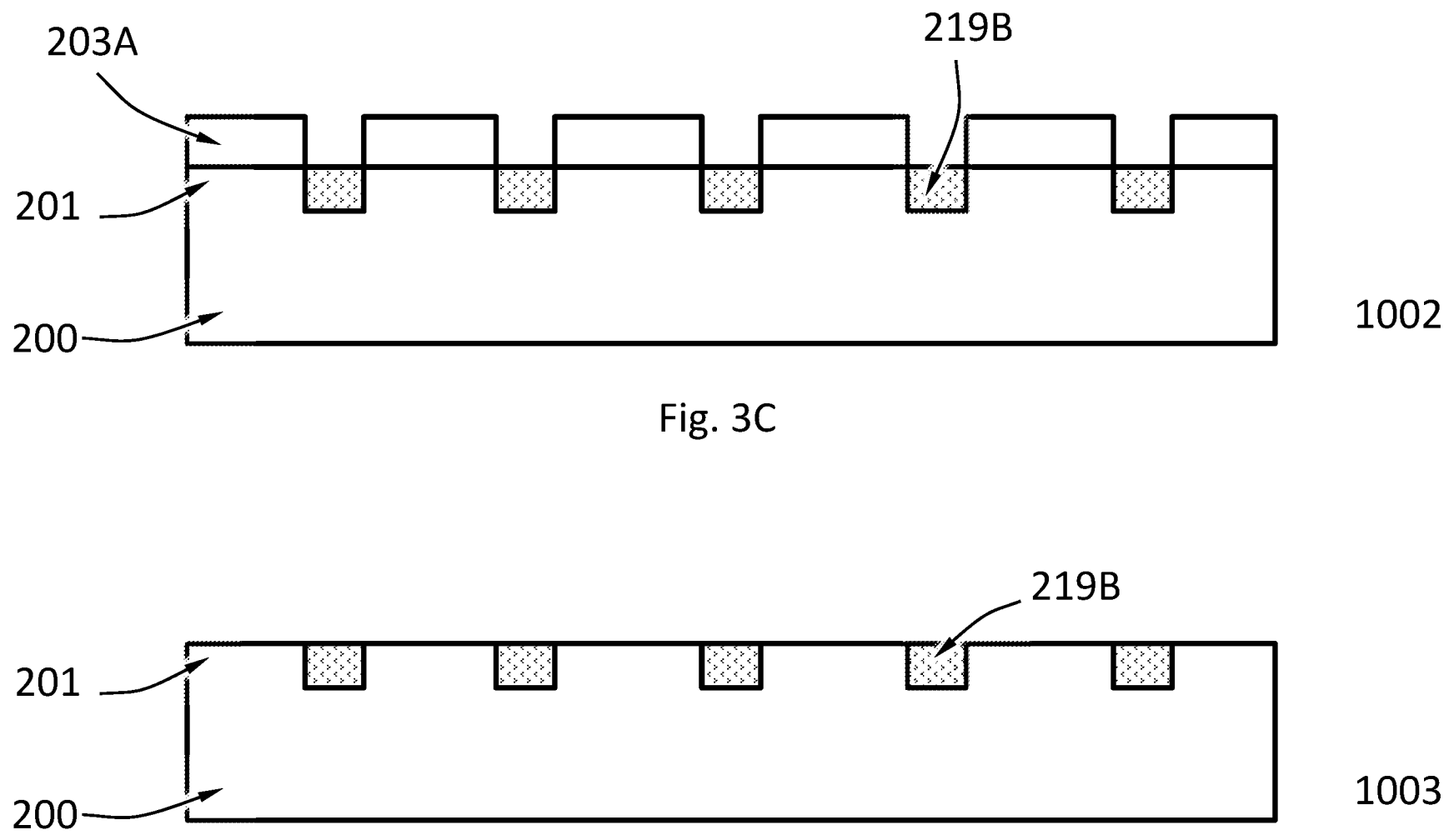
Figure 3E:
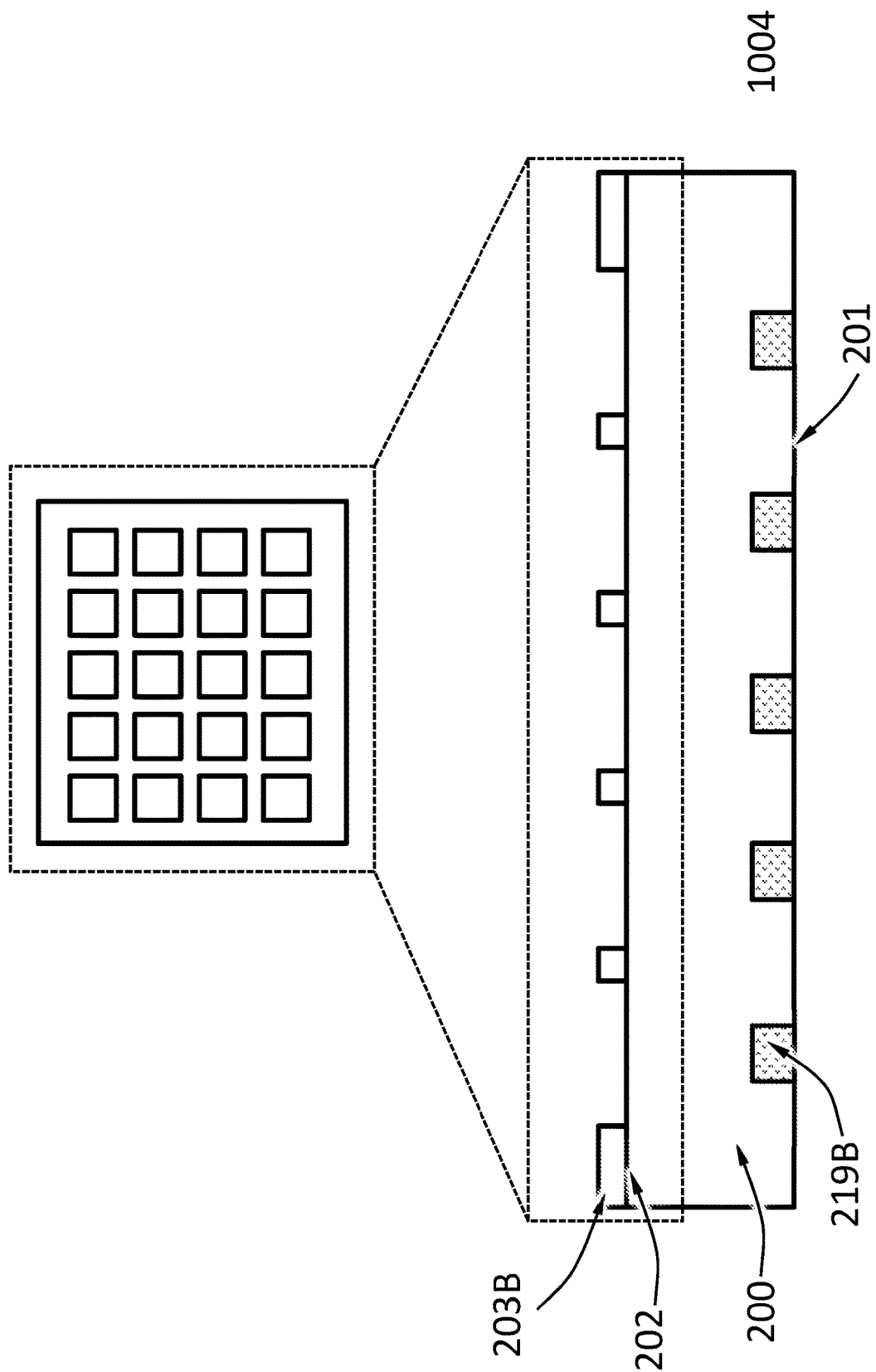

FIGS. 3A-3N schematically illustrate a process of forming the radiation absorption layer 110, according to an embodiment.

In step 1000-step 1003, heavily doped semiconductor regions of an electrical contact 219B are formed. The electrical contact 219B may function as the electrical contact 119B in FIG. 2B and FIG. 2C.

In step 1000, a mask layer 203A is formed onto a surface 201 of a substrate 200. The substrate 200 may include a semiconductor material such as, silicon, germanium, GaAs, or a combination thereof. The substrate 200 may be an intrinsic semiconductor (e.g., $<10^{12}$ dopants/cm$^3$, $<10^{11}$ dopants/cm$^3$, $<10^{10}$ dopants/cm$^3$, $<10^9$ dopants/cm$^3$). The mask layer 203A may comprise a material such as photoresist, silicon dioxide, silicon nitride, amorphous carbon or metals (e.g., aluminum, chromium). The mask layer 203A may be formed onto the surface 201 by various techniques, such as physical vapor deposition, chemical vapor deposition, spin coating, sputtering or another suitable process.

In step 1001, the mask layer 203A is patterned to have openings in which the substrate 200 is exposed. Shapes and locations of the openings correspond to the footprint shapes and locations of the heavily doped semiconductor regions to be formed in step 1002. The pattern formation on the mask layer 203A may involve lithography process or any other suitable processes. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 1002, the heavily doped semiconductor regions of the electrical contact 219B may be formed by diffusing or implanting a suitable dopant into regions of the substrate 200 exposed through the openings of the mask layer 203A. The dopants cannot penetrate through the mask layer 203A and enter into the regions of the substrate 200 covered by the mask layer 203A. The heavily doped semiconductor regions may have a doping level of $10^{18}$ dopants/cm$^3$ or above.

In step 1003, the mask layer 203A may be removed, and the substrate may be annealed to drive the dopants into the substrate 200 to a desired depth.

In step 1004-step 1006, the recesses 204 are formed, which may function as the recesses 104 in FIG. 2B and FIG. 2C.

In step 1004, a mask layer 203B is formed onto another surface 202 and patterned to have openings by processes similar to the step 1000 and step 1001. The mask layer 203B may serve as an etch mask for forming recesses 204 as shown in step 1005a or step 1005b. The mask layer 203B may comprise a material such as silicon dioxide, silicon nitride, amorphous carbon or metals (e.g., aluminum, chromium). A photoresist layer may be first deposited (e.g., by spin coating) onto the surface of the mask layer 203B, and lithography may follow to form the openings. Shapes and locations of the openings correspond to the footprint shapes and locations of the recesses 204 to be formed in step 1005a or step 1005b. If the openings have a square shape (as shown in the top view in step 1004) and are arranged into a rectangular array, the recesses 204 also have a square shape in their footprint and are arranged into a rectangular array. The thickness of the mask layer 203B may be determined according to the depth of the recesses 204 and etching selectivity (i.e., ratio of etching rates of the mask layer 203B and the substrate 200). In an embodiment, the mask layer 203B may have a thickness of a few microns.

In step 1005a or step 1005b, the recesses 204 are formed into the other surface 202 of the substrate 200 by etching portions of the substrate 200 exposed through the openings of the mask layer 203B to a desired depth. In the example of FIGS. 3A-3N, the recesses formed 104 are deep enough to expose the heavily doped regions of the electrical contact 219B. Each of the recesses 204 may have a shape of a frustum, prism, pyramid, cuboid, cubic or cylinder. In the example of step 1005a, the recesses 204 have a truncated pyramid shape; and in the example of step 1005b, the recesses 204 have a cuboid shape. Each of the recesses 204 may have a smooth surface.

In an embodiment, etching the portions of the substrate 200 may be carried out by wet etching, dry etching or a combination thereof. Wet etching is a type of etching processes using liquid-phase etchants. A substrate may be immersed in a bath of etchant, and areas not protected by the masks may be removed. The dimensions and shape of the recesses 204 may be defined not only by dimensions and shape of the openings of the mask layer 203B, but also material of the substrate 200, liquid chemicals or etchants used, etching rate and duration, etc. In an embodiment, the substrate 200 may be a silicon substrate, and recesses 204 may be formed by anisotropic wet etching with etchants such as potassium hydroxide (KOH), ethylenediamine pyrocatechol (EDP), tetramethylammonium hydroxide (TMAH), etc. During an anisotropic wet etching of the silicon substrate, liquid etchants may etch the silicon substrate at different rates depending upon the silicon crystalline plane exposed to the etchants, so that recesses 204 with different shapes and dimensions may be formed. In the example of step 1005a, when the other surface 202 is a (100) silicon crystallographic plane, using wet etchants such as KOH can from pyramidal-shaped recesses 204 with flat and angled etched walls. In the example of step 1005b, when the other surface 202 is a (110) silicon crystallographic plane, using wet etchants such as KOH can from cuboidal-shaped recesses 204 instead.

In step 1006, the mask layer 203B may be removed after forming the recesses 204 by wet etching, chemical mechanical polishing or some other suitable techniques.

In step 1007-step 1009, semiconductor single crystals 206A (shown in step 1009) are formed in the recesses 204. The semiconductor single crystals 206A may function as the semiconductor single crystals 106 in FIG. 2B and FIG. 2C. The semiconductor single crystals 206A formed may be in contact with the heavily doped semiconductor regions of the electrical contact 219B. The formation of the semiconductor single crystals 206A may be done by various techniques such as melt-growth technique, traveling heater technique, vapor deposition technique, epitaxial crystallization technique, or any other suitable techniques. A melt-growth technique involves melting semiconductor particles ("precursors") and recrystallizing the melt into a single crystal of the semiconductor. For example, melt-growth techniques such as vertical Bridgeman method and high-pressure Bridgman method may be used to form CdZnTe single crystals. A vapor deposition technique may involve vaporizing suitable semiconductor precursors and forming a semiconductor single crystal on a substrate from the vaporized semiconductor precursors. For example, a CdZnTe single crystal may be formed on a GaAs substrate from vaporized precursors cadmium telluride and zinc telluride. A vapor deposition technique may also be applied together with an epitaxial crystallization technique. For example, a metalorganic vapor-phase epitaxy technique can be used to form an epitaxial layer of CdTe or CdZnTe single crystal on a GaAs or Si substrate, with precursors such as dimethylcadmium (DMCd), dimethylzinc (DMZn) and diethyltellurium (DETe) and hydrogen as a carrier gas. Choice of suitable techniques to form semiconductor single crystals 206A in the recesses 204 depends on the properties of the semiconductor material, the substrate material, etc.

In the example of steps 1007-1009, formation of CdZnTe single crystals 206A in the recesses 204 is illustrated using a vertical Bridgeman technique. In step 1007, CdZnTe particles 205 (e.g., CnZnTe polycrystal particles) may be deposited into the recesses 204. In step 1008 and step 1009, the CdZnTe single crystals 206A may be formed by melting the CdZnTe particles 205, and then recrystallizing the melt by cooling the melt in the recesses 204. In the example of step 1008, the formation process may be carried out in a vertical Bridgeman furnace 210 comprising a growth chamber 213 and heating elements 214. The substrate 200 (with the CdZnTe particles 205) is enclosed in the growth chamber 213, which can move relative to the heating elements 214. The temperature profile of the furnace 210 may be controlled by the heating elements 214, so that the furnace 210 may have a hot zone 215a and a gradient zone 215b. The hot zone 215a may have a temperature equal to or above the melting temperature of the CdZnTe particles 205. In the gradient zone 215b, temperature gradually decreases from the temperature in the hot zone 215a to temperatures below the melting temperature. When the growth chamber 213 is in the hot zone 215a, the CdZnTe particles 205 in the recesses 204 melt. The melt consists of volatile components to form a vapor above the melt, and the vapor predominantly consists of Cd atoms since Cd has the highest vapor pressure among the CdZnTe melt constituents. To suppress possible leakage of the vapor and to reduce the possibility of chamber rupture, the growth chamber 213 may be pressurized with an inert gas 216 such as argon. As the growth chamber 213 enters the gradient zone 215b from the hot zone 215a (e.g., along a direction shown by a dashed arrow) at a very low speed (e.g., 1-2 mm/h), the melt is cooled and starts to recrystallize from the lower end so that CdZnTe single crystals 206A form progressively in the recesses 204. In an embodiment, additional Cd vapor may be sent into the growth chamber 213 to compensate any Cd loss and provide a fine control of molar concentrations of Cd and Zn of the CdZnTe single crystals. In an embodiment, the formation process can also be carried out in a horizontal geometry.

Sometimes, a recess 204 may contain more than one semiconductor single crystal. For example, a semiconductor polycrystal 206B or amorphous (or non-crystalline) semiconductor particle may be formed in a recess 204 instead of a semiconductor single crystal 206A. The semiconductor polycrystal 206B comprises more than one crystallites that of different size and orientation in it. The yield of the semiconductor single crystals 206A (i.e., the percentage of recesses 204 that have only semiconductor single crystals 206A) may depend on the formation technique applied, properties of the semiconductor material, formation conditions, etc. In the example of step 1008, the yield of CdZnTe single crystals may be tuned by the cooling rate, which can be adjusted the moving speed of the growth chamber 213, length of the gradient zone 215b, etc.

In step 1009, the other surface 202 of the substrate 200 and/or the surface of each of the semiconductor single crystals 206A may be polished after the formation of the semiconductor single crystals 206A, by wet etching, chemical mechanical polishing or some other suitable techniques. The surfaces 202 and 208 may be flat, smooth and coextensive after polishing.

Other procedures may be carried out after forming the semiconductor single crystals 206A, such as electrical contact deposition and surface passivation (e.g., step 1010-step 1012), or bonding with Read-Out circuits (e.g., FIG. 4). These procedures may be performed at low temperatures (e.g., below 200° C.) to prevent deterioration of the semiconductor single crystals 206A. For example, CdZnTe single crystals may loose their charge transport properties after high temperature exposure (e.g., above 200° C.).

In step 1010-step 1012, a passivation layer 209 and another electrical contact 219A are formed. The passivation layer 209 and the electrical contact 219A may function as the passivation layer 109 and the electrical contact 119A respectively in FIG. 2B and FIG. 2C.

In step 1010, the passivation layer 209 may be formed by depositing a high-resistivity material such as silicon dioxide or silicon nitride onto the other surface 202 of the substrate

200. The deposition may be done by a suitable technique such as sputtering or evaporation. For example, a silicon nitride layer may be deposited onto the other surface 202 in a sputtering system using an elemental Si target and $N_2$ as a reactive gas, while low temperature (e.g. <100° C.) may be maintained to avoid degradation of the semiconductor single crystals 206A such as CdZnTe single crystals.

In step 1011, discrete regions of the electrical contact 219A maybe formed onto the surfaces 208 of the semiconductor single crystals 206A and/or polycrystals 206B. In the example of step 1011, the electrical contact 219A has a same configuration as the electrical contact 119A in FIG. 2B, that is, each of the discrete regions is embedded in the passivation layer 209 and has a surface exposed. In the example of FIGS. 3A-3N, the passivation layer 209 is formed before forming the electrical contact 219A and serve as a mask to form the discrete regions. The passivation layer 209 may be patterned by a way similar to the step 1001 to have openings in which the substrate 200 is exposed. The locations of the openings correspond to the footprint locations of the semiconductor single crystals 206A and/or polycrystals 206B. A conducting material such as a metal (e.g., gold, copper, aluminum, platinum, etc.) may be deposited into the openings to form the discrete regions of the electrical contact 219A by a suitable technique such as sputtering or evaporation.

In an embodiment, the discrete regions of the electrical contact 219A may be formed before forming the passivation layer 209, by a way involving lithography techniques similar to steps 1000 and 1001, conductive material deposition and mask removal. The passivation layer 209 may be formed by filling the spaces in between the discrete regions with a high-resistivity passivation material.

In optional step 1012, a planar portion of the electrical contact 219A may be formed by depositing a layer of a conductive material such as metal onto the passivation layer 109 and the discrete regions of the electrical contact 219A. The electrical contact 219A in the example of step 1012 has a same configuration as the electrical contact 119A in FIG. 2C.

In FIGS. 3A-3N, some intermediate or post steps such as surface cleaning, polishing, side surface passivation or coating, substrate dicing may be carried out but are not shown. For example, more than one die may be formed on the substrate 200, and each die may be diced off from the substrate 200 and may function as an embodiment of the radiation absorption layer 110. The order of the steps shown in FIGS. 3A-3N may be changed to suit different formation needs.

FIG. 4 schematically illustrates bonding between the radiation absorption layer 110 and the electronics layer 120 to form the radiation detector 100, according an embodiment. In the example of FIG. 4, the radiation absorption layer 110 may comprise one or more semiconductor polycrystals 107 or amorphous (or non-crystalline) semiconductor particles in one or more recesses 104 respectively, besides the semiconductor single crystals 106. The radiation absorption layer 110 may be bonded to the electronics layer 120 directly or using an interface board. In the example of FIG. 4, the radiation absorption layer 110 and the electronics layer 120 may have a matching pad distribution, and each of the heavily doped semiconductor regions of the electrical contact 119B may bond to each of the vias 131 by a suitable technique such as direct bonding or flip chip bonding. Each of the heavily doped semiconductor regions may also serve as buffer layer for the semiconductor single crystals 106 during the bonding and prevent breaking the semiconductor single crystals 106 when pressure is applied to the radiation absorption layer 110.

Direct bonding is a wafer bonding process without any additional intermediate layers (e.g., solder bumps). The bonding process is based on chemical bonds between two surfaces. Direct bonding may be at elevated temperature but not necessarily so.

Flip chip bonding uses solder bumps 132 deposited onto contact pads (e.g., heavily doped semiconductor regions of the electrical contact 119B or contacting surfaces of the vias 131). Either the radiation absorption layer 110 or the electronic layer 120 is flipped over and the heavily doped semiconductor regions of the electrical contact 119B are aligned to the vias 131. The solder bumps 132 may be melted to solder the electrical contact 119B and the vias 131 together. Any void space among the solder bumps 132 may be filled with an insulating material.

Low-temperature bonding technology may be employed during the bonding to maintain a temperature of the radiation detector 100 in a certain range. For example, the temperature of the radiation detector 100 with CdZnTe single crystals during the bonding may be kept in the 60° C.-150° C. range to prevent degradation of CdZnTe single crystals.

Figure 5:
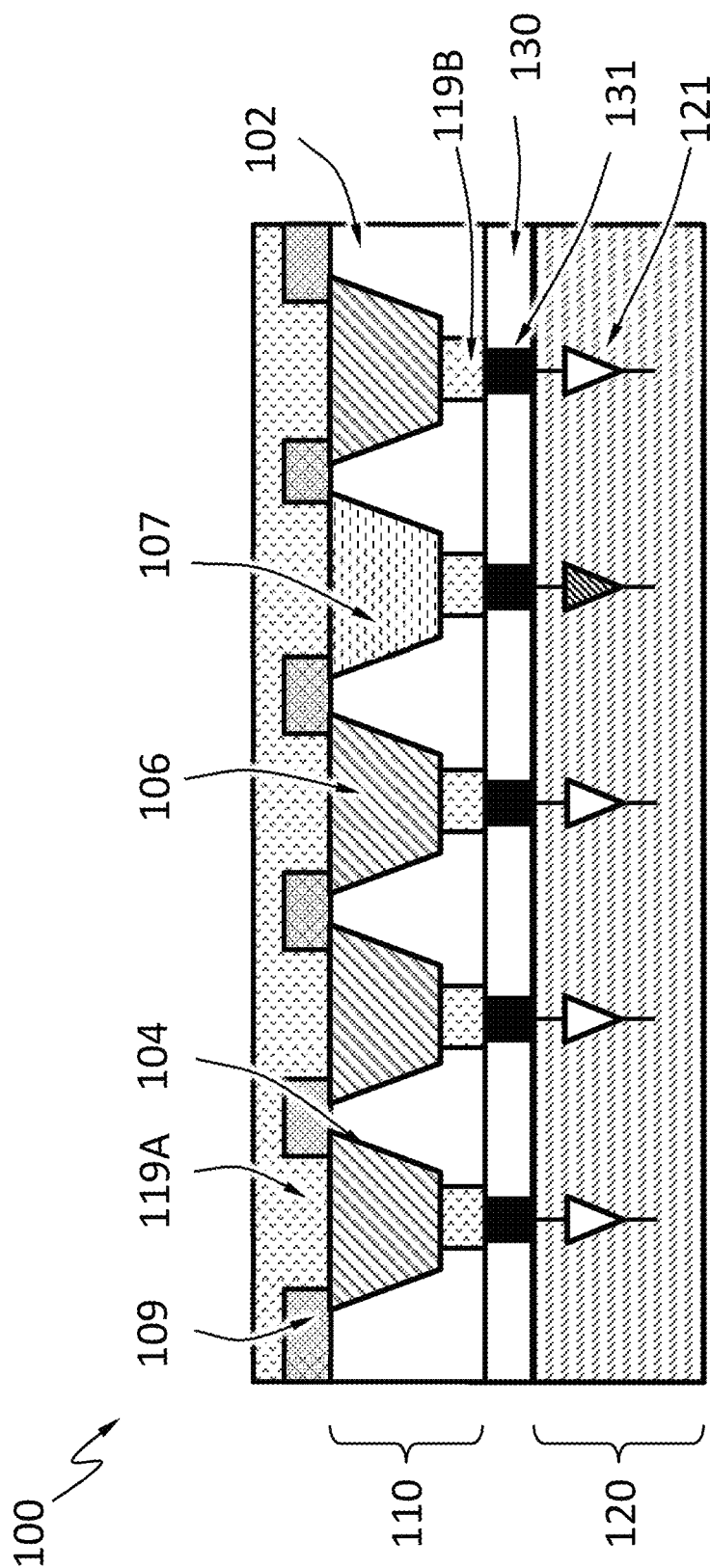
FIG. 5 schematically illustrates the radiation detector having a pixel being deactivated, according to an embodiment.

As shown in FIG. 5, the radiation detector 100 may have one or more pixels 150 associated with one or more heavily doped semiconductor regions of the electrical contact 119B, the one or more heavily doped semiconductor regions being deactivated. A production test may be carried out to test each of the pixels 150 associated with a heavily doped semiconductor region of the electrical contact 119B. A voltage bias (e.g., 5 volts) may be applied to each of pixels 150 being tested. The electronic system 121 may be configured to measure a first voltage of the heavily doped semiconductor region of the electrical contact 119B caused by the dark current during a fixed time, or the time it takes for the first voltage to reach a threshold voltage, or a second voltage of the heavily doped semiconductor region of the electrical contact 119B caused by current generated upon absorption of radiation particles from an standard radiation source during a fixed time, or the time it takes for the second voltage to reach the threshold voltage. The first voltage or a signal to noise ratio (defined as the ratio of the second voltage of the electrical contact 119B to the first voltage of the electrical contact 119B) may be used to determine whether a pixel 150 need to be deactivated or voided. For example, if a discrete region of the electrical contact 119B associated with a pixel 150 has a first voltage or a signal to noise ratio larger than a tolerated value, the pixel 150 may be deactivated by the electronic system 121 during normal operations of the radiation detector 100. In the example of FIG. 5, the heavily doped semiconductor regions of the electrical contact 119B in contact with a semiconductor polycrystal 107 or amorphous (or non-crystalline) semiconductor particle may have a first voltage or a signal to noise ratio larger than the tolerated value, and the pixels 150 associated may be deactivated.

Figure 6A:
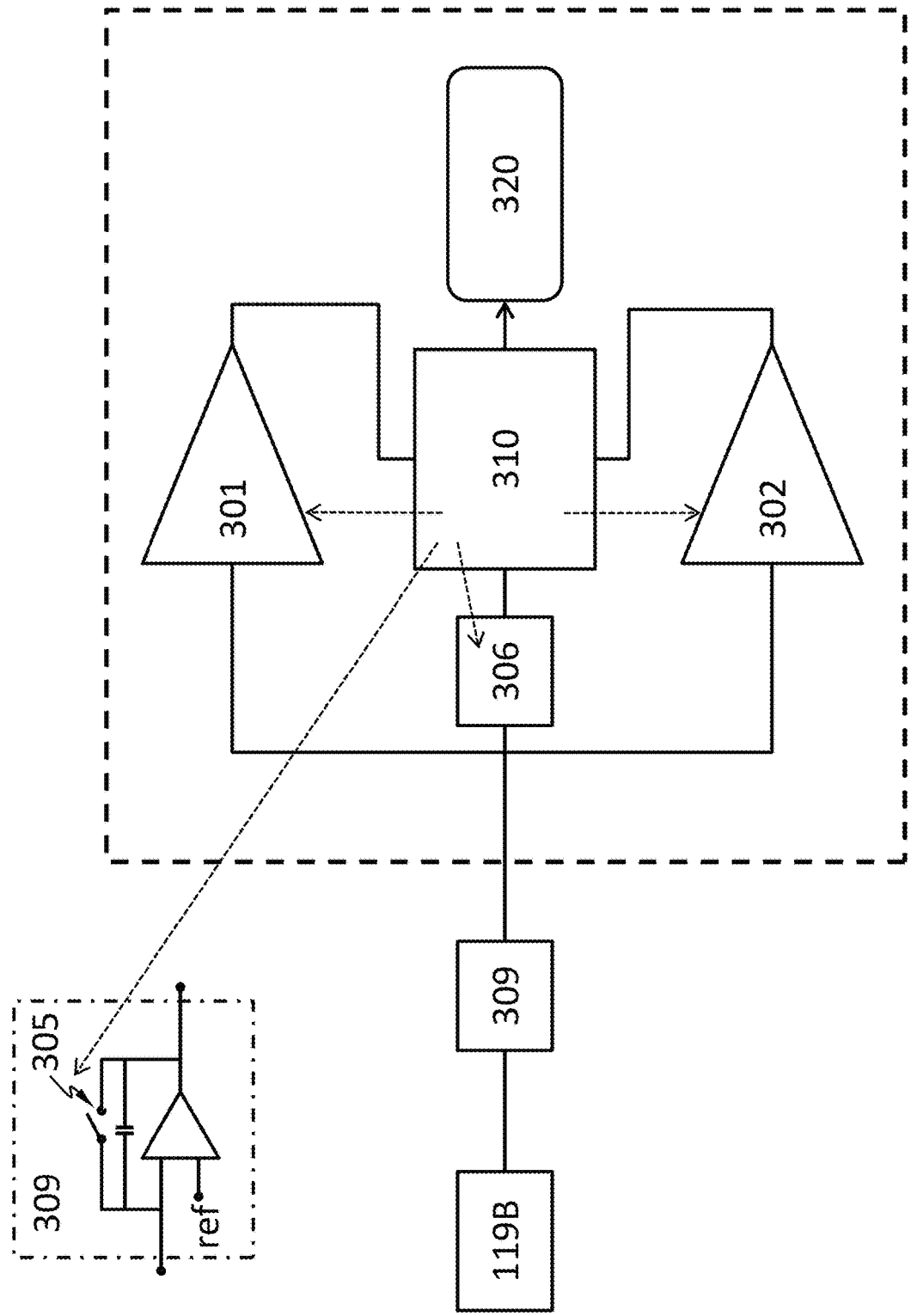
FIG. 6A and FIG. 6B each show a component diagram of the electronic system, according to an embodiment.
Figure 6B:
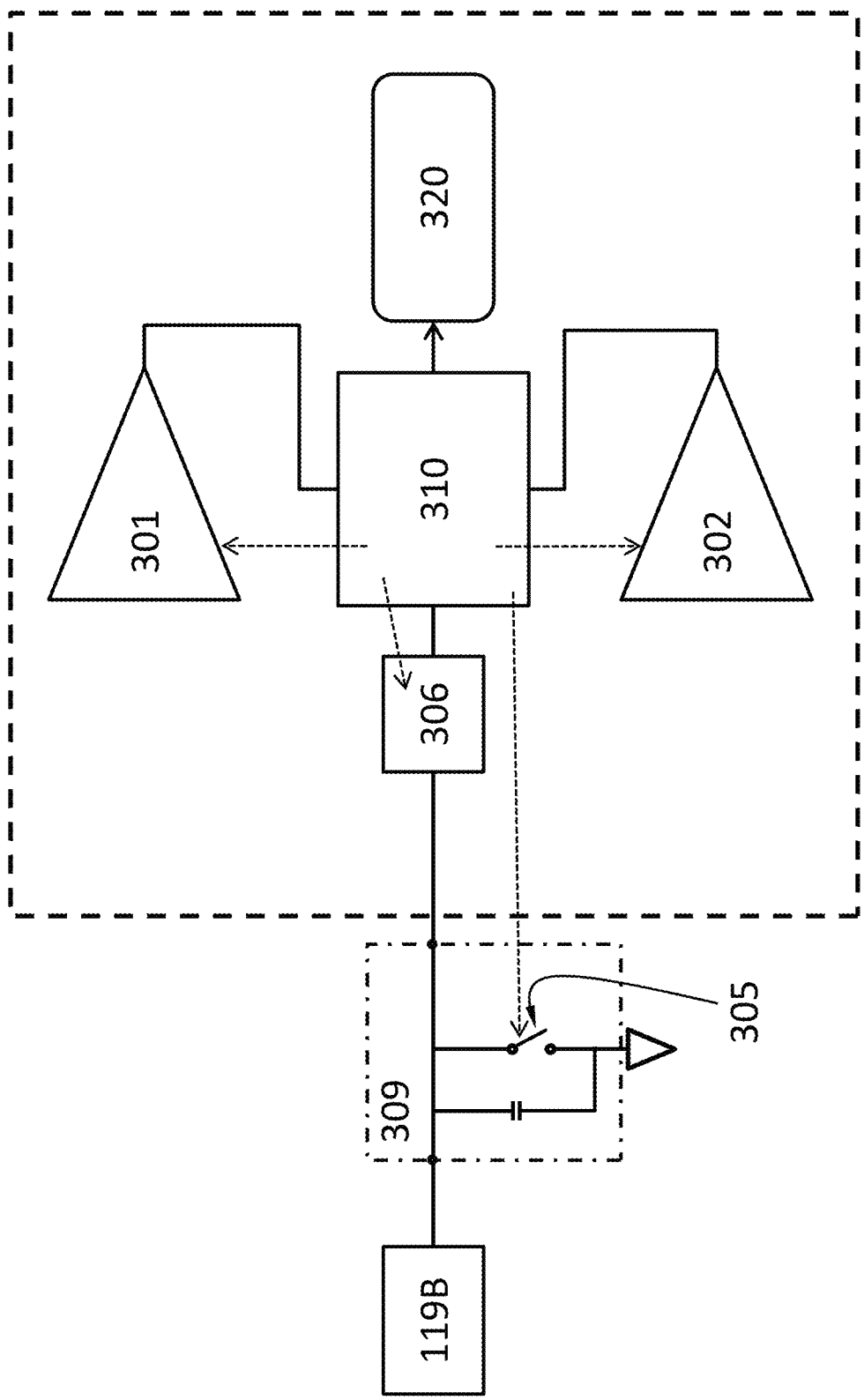

FIG. 6A and FIG. 6B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of an electrode (e.g., a heavily doped semiconductor region of electrical contact 119B on a semiconductor single crystal 106) to a first threshold. The first voltage comparator 301 may be configured to monitor the voltage directly, or calculate the voltage by integrating an electric current flowing through the electrode over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the electronic system 121 misses signals generated by an incident radiation particle. The first voltage comparator 301 configured as a continuous comparator is especially suitable when the incident radiation intensity is relatively high. The first voltage comparator 301 may be a clocked comparator, which has the benefit of lower power consumption. The first voltage comparator 301 configured as a clocked comparator may cause the electronic system 121 to miss signals generated by some incident radiation particles. When the incident radiation intensity is low, the chance of missing an incident radiation particle is low because the time interval between two successive radiation particles is relatively long. Therefore, the first voltage comparator 301 configured as a clocked comparator is especially suitable when the incident radiation intensity is relatively low. The first threshold may be 5-10%, 10%-20%, 20-30%, 30-40% or 40-50% of the maximum voltage one incident radiation particle may generate in the semiconductor single crystal 106. The maximum voltage may depend on the energy of the incident radiation particle (i.e., the wavelength of the incident radiation), the material of the radiation absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the electrode over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, & \text{if } x \geq 0 \\ -x, & \text{if } x \leq 0 \end{cases}.$$

The second threshold may be 200%-300% of the first threshold. The second threshold may be at least 50% of the maximum voltage one incident radiation particle may generate in the semiconductor single crystal 106. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the electronic system 121 to operate under a high flux of incident radiation. However, having a high speed is often at the cost of power consumption.

The counter 320 is configured to register a number of radiation particles reaching the semiconductor single crystal 106. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on the voltage of which electrode (e.g., a cathode or an anode) is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the electrode to an electrical ground, so as to reset the voltage and discharge any charge carriers accumulated on the electrode. In an embodiment, the electrode is connected to an electrical ground after the expiration of the time delay. In an embodiment, the electrode is connected to an electrical ground for a finite reset time period. The controller 310 may connect the electrode to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

Figure 7:
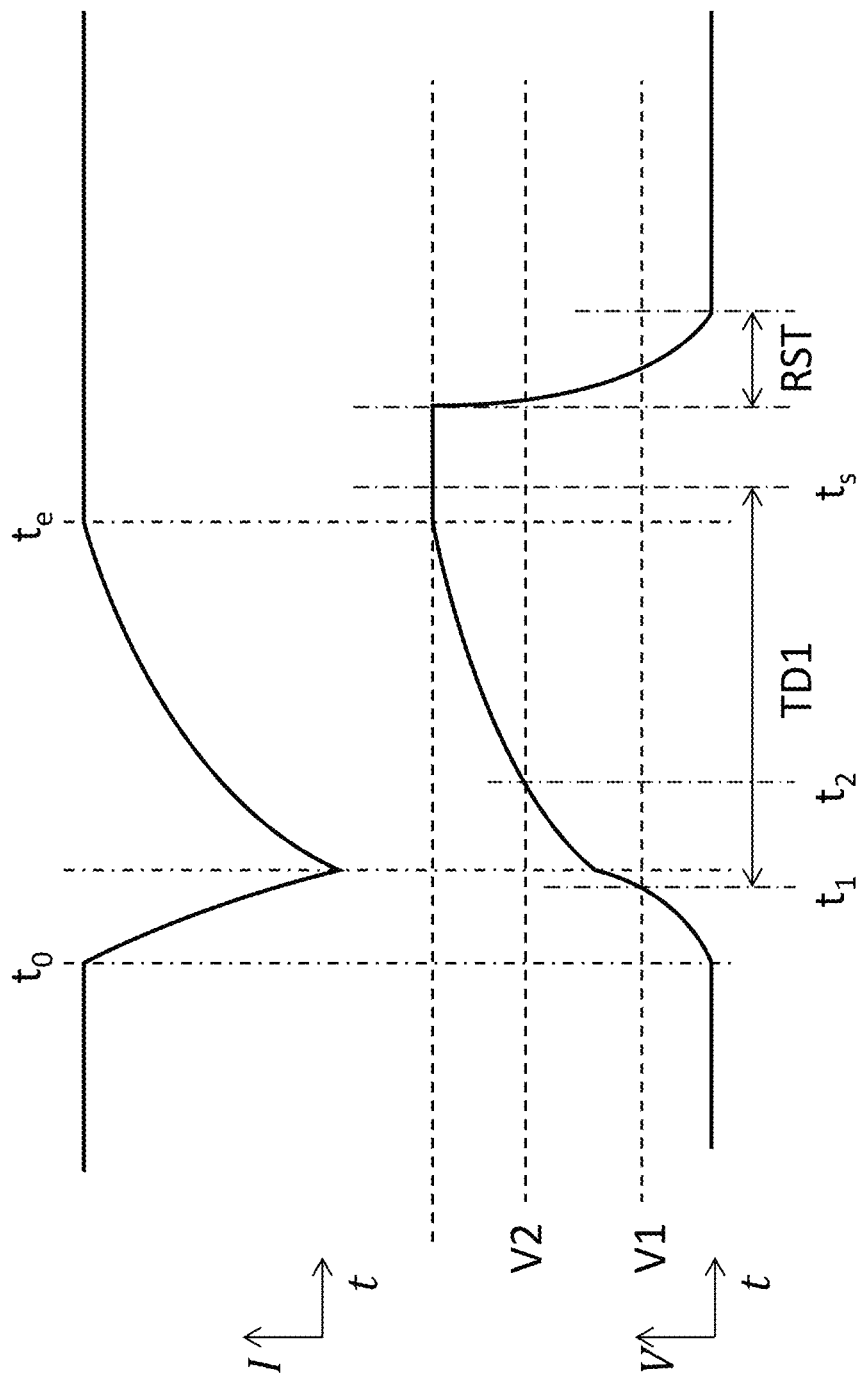
FIG. 7 schematically shows a temporal change of the voltage of the electrode or the electrical contact, according to an embodiment.

The electronic system 121 may include a capacitor module 309 electrically connected to the electrode, wherein the capacitor module is configured to collect charge carriers from the electrode. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period") (e.g., as shown in FIG. 7, between $t_0$ to $t_1$, or $t_1$-$t_2$). After the integration period has expired, the capacitor voltage is sampled and then reset by a reset switch. The capacitor module can include a capacitor directly connected to the electrode.

FIG. 7 schematically shows a temporal change of the electric current flowing through the electrode (upper curve) caused by charge carriers generated by a radiation particle incident on the semiconductor single crystal 106, and a corresponding temporal change of the voltage of the electrode (lower curve). The voltage may be an integral of the electric current with respect to time. At time $t_0$, the radiation particle hits the semiconductor single crystal 106, charge carriers start being generated in the semiconductor single crystal 106, electric current starts to flow through the electrode of the semiconductor single crystal 106, and the absolute value of the voltage of the electrode or electrode starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the radiation particle drift out of the radiation absorption layer 110. At time $t_s$, the time delay TD1 expires. In the example of FIG. 7, time $t_s$ is after time $t_e$; namely TD1 expires after all charge carriers generated by the radiation particle drift out of the radiation absorption layer 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by a radiation particle, which relates to the energy of the radiation particle. The controller 310 may be configured to determine the energy of the radiation particle based on voltage the voltmeter 306 measures. One way to determine the energy is by binning the voltage. The counter 320 may have a sub-counter for each bin. When the controller 310 determines that the energy of the radiation particle falls in a bin, the controller 310 may cause the number registered in the sub-counter for that bin to increase by one. Therefore, the electronic system 121 may be able to detect a radiation image and may be able to resolve radiation particle energies of each radiation particle.

After TD1 expires, the controller 310 connects the electrode to an electric ground for a reset period RST to allow charge carriers accumulated on the electrode to flow to the ground and reset the voltage. After RST, the electronic system 121 is ready to detect another incident radiation particle. Implicitly, the rate of incident radiation particles the electronic system 121 can handle in the example of FIG. 7 is limited by 1/(TD1+RST). If the first voltage comparator 301 has been deactivated, the controller 310 can activate it at any time before RST expires. If the controller 310 has been deactivated, it may be activated before RST expires.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   forming a recess into a substrate of semiconductor;
   forming a semiconductor single crystal in the recess, the semiconductor single crystal having a different composition from the substrate and having a surface exposed;
   forming a heavily doped semiconductor region in the substrate, wherein the heavily doped semiconductor region is in electrical contact with the semiconductor single crystal and directly embedded in a portion of intrinsic semiconductor of the substrate.

2. The method of claim 1, wherein the heavily doped semiconductor region extends from an interface between the semiconductor single crystal and the substrate to a surface of the substrate.

3. The method of claim 1, wherein forming the heavily doped semiconductor region is carried out before forming the recess.

4. The method of claim 1, wherein forming the heavily doped semiconductor region is carried out before forming the semiconductor single crystal.

5. The method of claim 1, further comprising forming an electrical contact on the surface of the semiconductor single crystal and depositing a passivation layer on the surface of the semiconductor single crystal or the surface of the substrate; wherein the electrical contact is embedded in the passivation layer.

6. The method of claim 5, further comprising polishing the substrate or the semiconductor single crystal such that the surface of the semiconductor single crystal and the surface of the substrate are coextensive.

7. The method of claim 5, further comprising depositing a layer of conductive material on the passivation layer and the electrical contact.

8. The method of claim 5, wherein the passivation layer comprises silicon dioxide or silicon nitride.

9. The method of claim 1, wherein the substrate comprises silicon, germanium, GaAs or a combination thereof.

10. The method of claim 1, wherein the semiconductor single crystal is a cadmium zinc telluride (CdZnTe) single crystal or a cadmium telluride (CdTe) single crystal.

11. The method of claim 1, wherein the recess does not contain other semiconductor material except the semiconductor single crystal, after forming the semiconductor single crystal.

12. The method of claim 1, wherein the recess does not contain a semiconductor polycrystal, after forming the semiconductor single crystal.

13. The method of claim 1, wherein the recess has a shape of a frustum, prism, pyramid, cuboid, cubic or cylinder.

14. The method of claim 1, wherein forming the recess comprises forming a mask on the substrate and etching a portion of the substrate uncovered by the mask.

15. The method of claim 1, wherein etching the portion is done by wet etching, dry etching or a combination thereof.

16. The method of claim 1, wherein forming the semiconductor single crystal in the recess comprises depositing semiconductor particles into the recess, forming a melt by melting the semiconductor particles, and recrystallizing the melt in the recess.

17. The method of claim 16, wherein recrystallizing the melt in the recess involves cooling the melt at a rate that the melt recrystallizes into a single crystal.

18. The method of claim 17, wherein cooling the melt is done by moving the melt from a zone with a temperature above or equal to a melting point of the semiconductor particles to another zone with a temperature below the melting point.

19. The method of claim 1, wherein forming the semiconductor single crystal comprises using a vapor phase precursor.

20. The method of claim 1, further comprising bonding the substrate to another substrate comprising an electronic system therein or thereon, wherein the electronic system is electrically connect to the substrate and configured to process an electrical signal generated in the substrate.

* * * * *